US012772450B2

(12) United States Patent
Kang

(10) Patent No.: US 12,772,450 B2
(45) Date of Patent: Oct. 20, 2026

(54) SEMICONDUCTOR DEVICE INCLUDING THROUGH ELECTRODE

(71) Applicant: SK hynix Inc., Icheon-si (KR)

(72) Inventor: Chang Woo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 554 days.

(21) Appl. No.: 18/351,000

(22) Filed: Jul. 12, 2023

(65) Prior Publication Data

US 2024/0324200 A1 Sep. 26, 2024

(30) Foreign Application Priority Data

Mar. 23, 2023 (KR) ........................ 10-2023-0037886

(51) Int. Cl.

| | |
|---|---|
| ***G11C 16/08*** | (2006.01) |
| ***H10B 41/10*** | (2023.01) |
| ***H10B 41/27*** | (2023.01) |
| ***H10B 43/10*** | (2023.01) |
| ***H10B 43/27*** | (2023.01) |
| ***H10W 20/41*** | (2026.01) |

(52) U.S. Cl.

CPC ............. *H10B 43/27* (2023.02); *G11C 16/08* (2013.01); *H10B 41/10* (2023.02); *H10B 41/27* (2023.02); *H10B 43/10* (2023.02); *H10W 20/435* (2026.01)

(58) Field of Classification Search

CPC ........ H10B 43/40; H10B 43/50; H10B 41/35; H10B 43/35

See application file for complete search history.

(56) References Cited

U.S. PATENT DOCUMENTS

| | | | | |
|---|---|---|---|---|
| 2021/0366919 | A1* | 11/2021 | Sung | H10B 43/50 |
| 2021/0375901 | A1* | 12/2021 | Oh | H10B 43/40 |
| 2021/0383874 | A1 | 12/2021 | Oh et al. | |
| 2022/0077126 | A1 | 3/2022 | Choi et al. | |
| 2022/0085048 | A1 | 3/2022 | Lee et al. | |

FOREIGN PATENT DOCUMENTS

| | | | | |
|---|---|---|---|---|
| CN | 110544497 A | * | 12/2019 | G11C 8/10 |
| KR | 20230011747 A | * | 1/2023 | H01L 27/11548 |

* cited by examiner

*Primary Examiner* — William B Partridge
*Assistant Examiner* — Felix B Andrews

(57) ABSTRACT

A semiconductor device may include a stacked structure including a plurality of interlayer insulating layers and a plurality of horizontal line layers alternately stacked, a plurality of channel structures passing through the plurality of interlayer insulating layers and the plurality of horizontal line layers, and a first through electrode and a second through electrode passing through the plurality of interlayer insulating layers and the plurality of horizontal line layers and connected to the plurality of horizontal line layers. There may be provided a first logic structure which is disposed under the stacked structure and includes a first lower pass transistor connected to the first through electrode. In addition, there may be provided a second logic structure which is disposed on the stacked structure and includes a first upper pass transistor connected to the second through electrode.

20 Claims, 29 Drawing Sheets

SEMICONDUCTOR DEVICE INCLUDING THROUGH ELECTRODE

CROSS-REFERENCE TO RELATED APPLICATION

The present application claims priority under 35 U.S.C. § 119(a) to Korean patent application number 10-2023-0037886 filed in the Korean Intellectual Property Office on Mar. 23, 2023, which is incorporated herein by reference in its entirety.

TECHNICAL FIELD

The embodiments of the present disclosure relate to a semiconductor device with a through electrode and a forming method of the same.

BACKGROUND

A technology using a stacked structure is being researched in accordance with the need for light, thin, and small-sized semiconductor devices. A plurality of memory cells may be three-dimensionally disposed in the stacked structure. A number of memory cells may be connected to logic circuitry. Logic circuitry may control erase (or initialize), write, and read operations for a plurality of memory cells.

As the number of electrode layers in the stacked structure increases, the number of memory cells may increase. The number of active/passive devices required to construct a logic circuit may also increase due to the increase in the number of memory cells. An increase in the number of active/passive devices may be an obstacle to high integration of semiconductor devices.

SUMMARY

Embodiments of the disclosure may provide a semiconductor device advantageous for high integration and a method of forming method the same.

A semiconductor device according to an embodiment of the disclosure may include a stacked structure including a plurality of interlayer insulating layers and a plurality of horizontal line layers alternately stacked, a plurality of channel structures passing through the plurality of interlayer insulating layers and the plurality of horizontal line layers, and a first through electrode and a second through electrode passing through the plurality of interlayer insulating layers and the plurality of horizontal line layers, each of the first through electrode and second through electrode connected to a different horizontal line layer. There may be provided a first logic structure, disposed under the stacked structure, that includes a first lower pass transistor connected to the first through electrode. In addition, there may be provided a second logic structure, disposed on the stacked structure, that includes a first upper pass transistor connected to the second through electrode. A semiconductor device according to an embodiment of the disclosure may include a stacked structure including a plurality of interlayer insulating layers and a plurality of horizontal line layers alternately stacked, a plurality of channel structures passing through the plurality of interlayer insulating layers and the plurality of horizontal line layers, and a first through electrode and a second through electrode passing through the plurality of interlayer insulating layers and the plurality of horizontal line layers, each of the first through electrode and second through electrode connected to a different horizontal line layer. There may be provided a first logic structure that is bonded to a lower portion of the stacked structure and includes a first lower pass transistor connected to the first through electrode. In addition, there may be provided a second logic structure that is bonded to an upper portion of the stacked structure and includes a first upper pass transistor connected to the second through electrode.

A semiconductor device according to an embodiment of the disclosure may include a stacked structure including a plurality of interlayer insulating layers and a plurality of horizontal line layers alternately stacked, a plurality of channel structures passing through the plurality of interlayer insulating layers and the plurality of horizontal line layers, and a first through electrode and a second through electrode passing through the plurality of interlayer insulating layers and the plurality of horizontal line layers and connected to the plurality of horizontal line layers. There may be provided a first logic structure, disposed under the stacked structure, that includes a first lower pass transistor connected to the first through electrode and a second lower pass transistor connected to the second through electrode. In addition, there may be provided a second logic structure, disposed on the stacked structure, that includes a first upper pass transistor connected to the first through electrode and a second upper pass transistor connected to the second through electrode.

According to the embodiments of the present disclosure, there may be provided a stacked structure bonded between a first logic structure and a second logic structure. The stacked structure may include a plurality of through electrodes connected to a plurality of horizontal line layers. A plurality of low pass transistors and a plurality of high pass transistors may be distributed and disposed within the first logic structure and the second logic structure. Each of the plurality of lower pass transistors disposed in the first logic structure may be connected to a lower end of a corresponding one of the plurality of through electrodes. Each of the plurality of upper pass transistors disposed in the second logic structure may be connected to an upper end of a corresponding one of the plurality of through electrodes. There may be reduced line density in the first logic structure, the second logic structure, and the stacked structure. It is thus possible to implement a semiconductor device which is advantageous for high integration and has excellent electrical characteristics.

DETAILED DESCRIPTION

Figure 1:
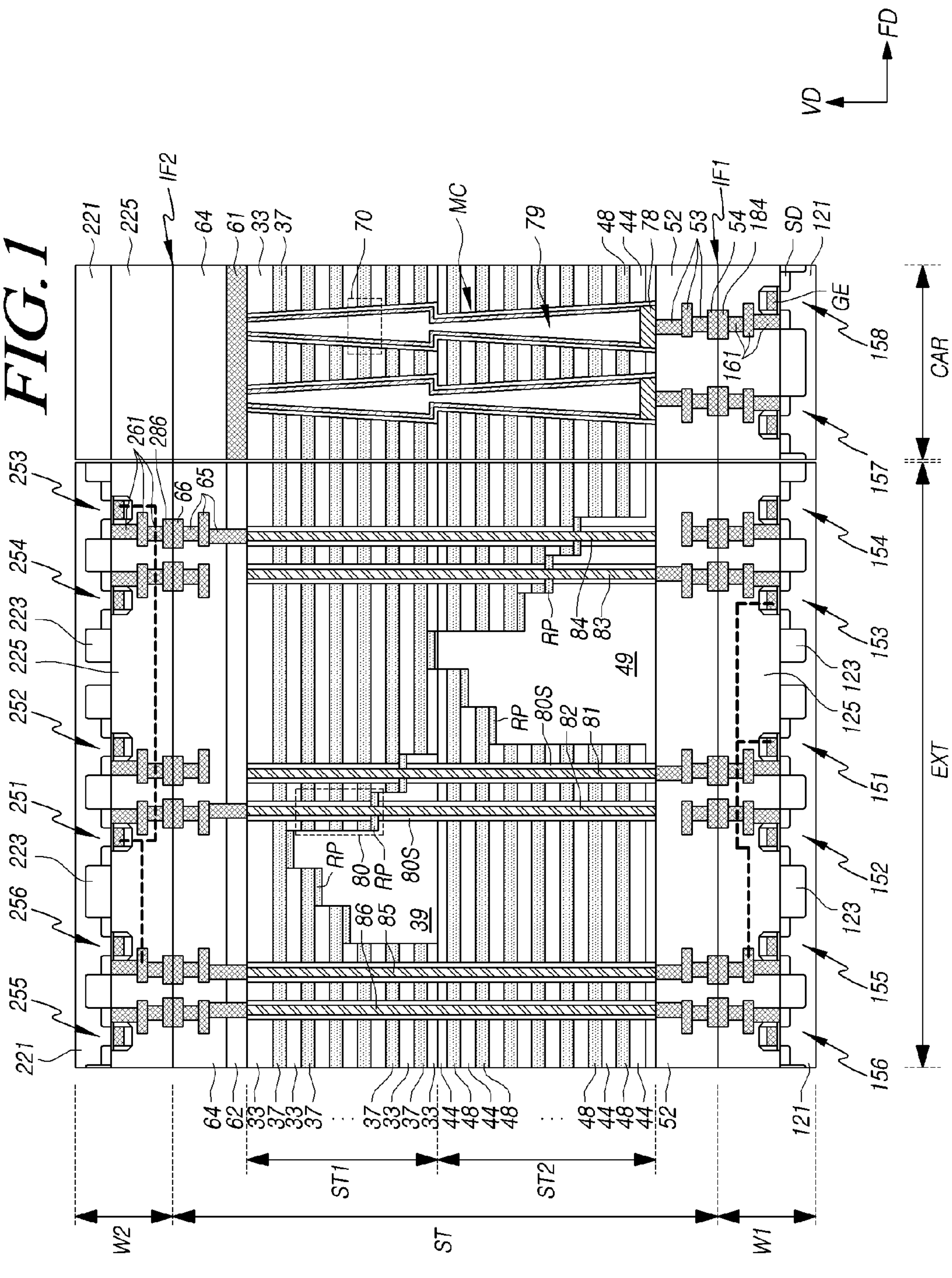
FIG. 1 and FIGS. 3 to 8 are cross-sectional views illustrating semiconductor devices according to embodiments of the present disclosure.
Figure 2:
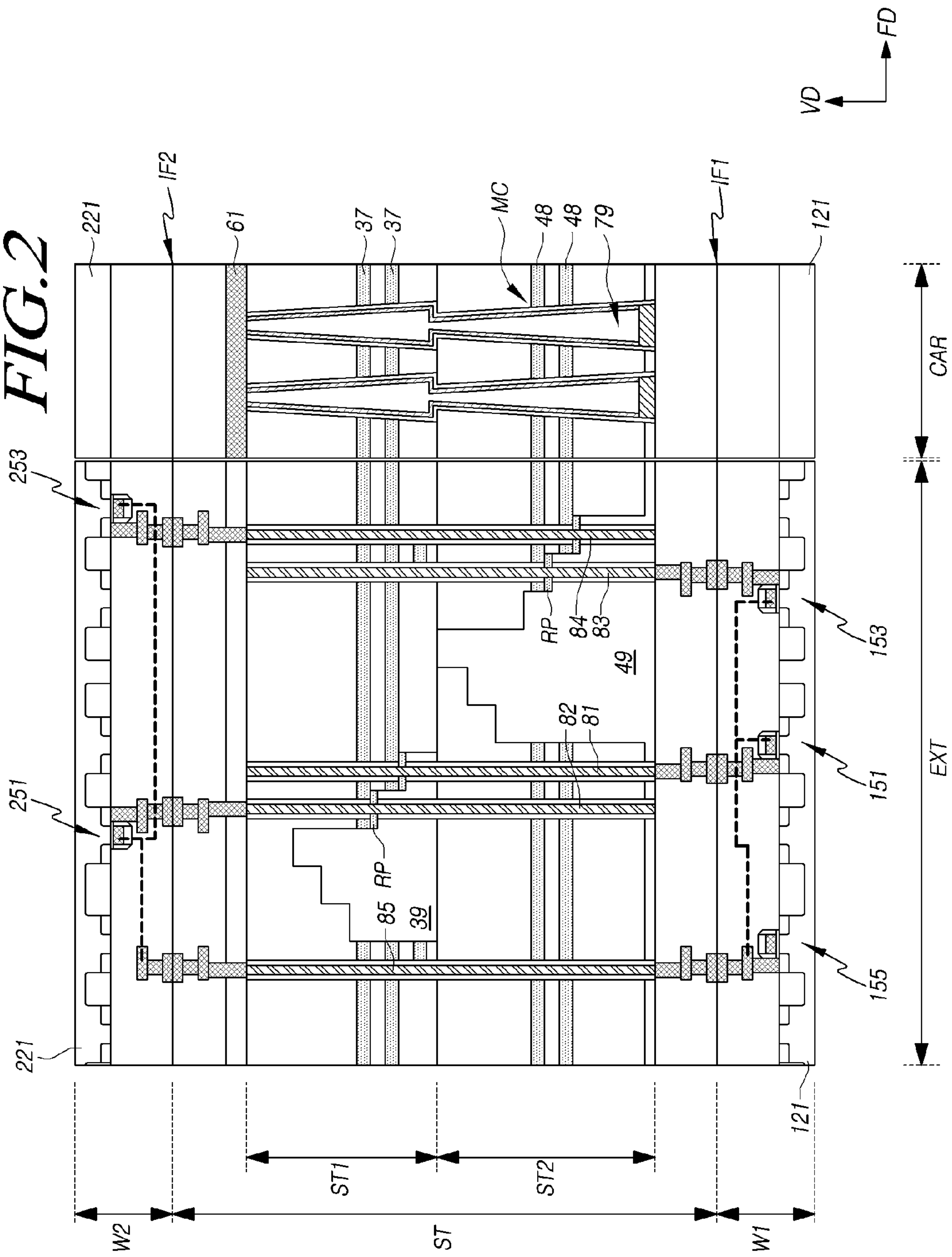
FIG. 2 illustrates a portion of a semiconductor device of FIG. 1.
Figure 10:
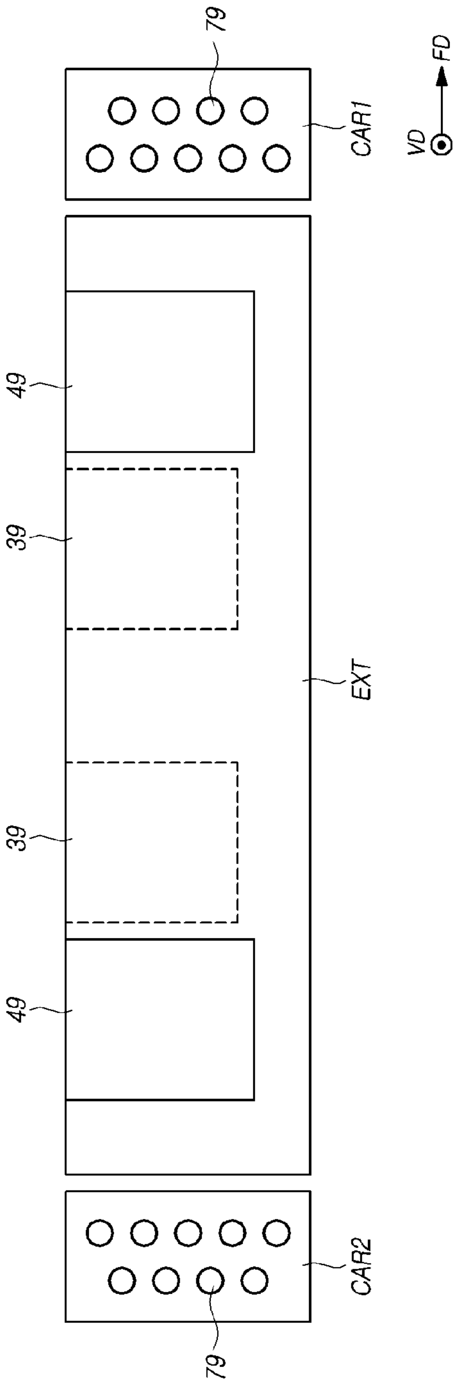
FIG. 10 illustrates a layout of a semiconductor device according to an embodiment of the present disclosure.
Figure 11:
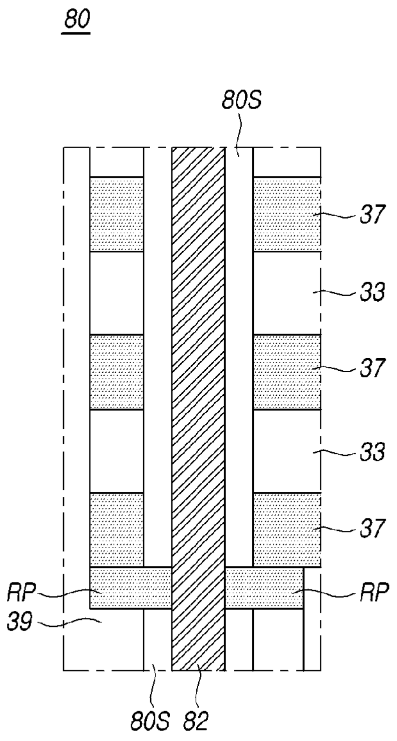
FIGS. 11 to 15 illustrate details of portions of FIG. 1.
Figure 12:
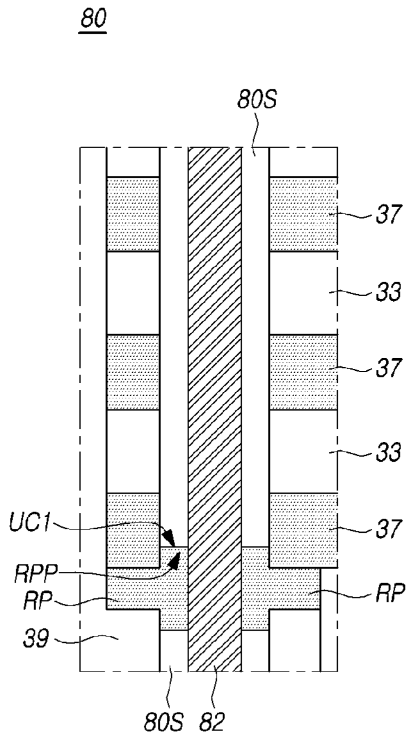
Figure 13:
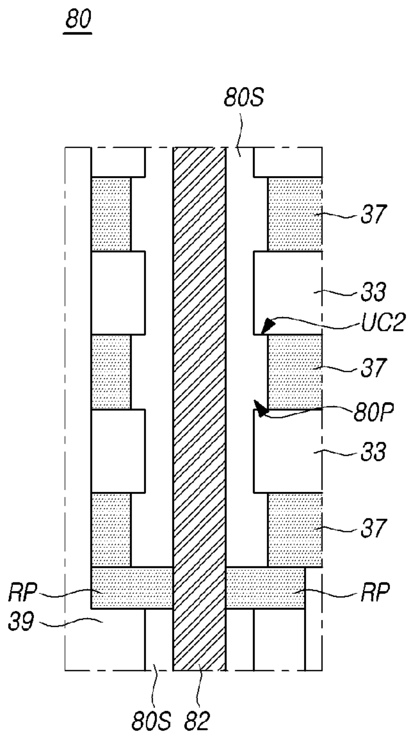
Figure 14:
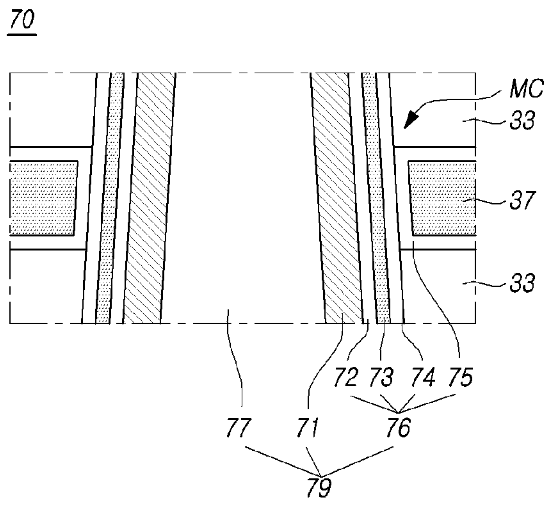
Figure 15:
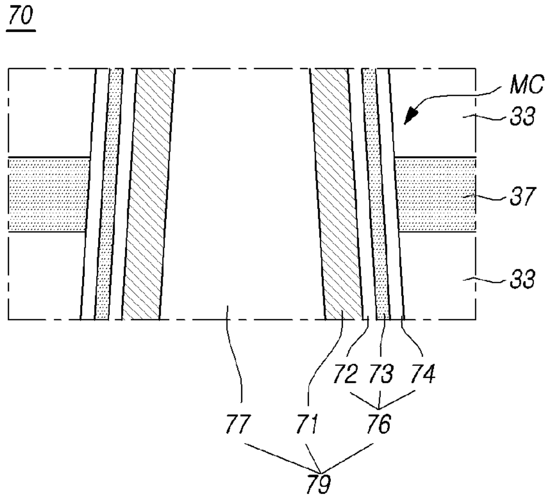

FIG. 1 and FIGS. 3 to 8 are cross-sectional views illustrating semiconductor devices according to embodiments of the present disclosure. FIG. 2 illustrates a portion of a semiconductor device of FIG. 1. FIG. 9 illustrates a portion of a semiconductor device of FIG. 8. FIG. 10 a layout of a semiconductor device according to an embodiment of the present disclosure. FIGS. 11 to 13 are partial views illustrating a detail portion 80 of FIG. 1, and FIGS. 14 and 15 are partial views illustrating a detail portion 70 of FIG. 1. A semiconductor device according to an embodiment of the present disclosure may include a 3D flash memory such as VNAND. A semiconductor device according to an embodiment of the present disclosure may include a shared slim structure.

Referring to FIG. 1 and FIG. 2, a semiconductor device according to an embodiment of the present disclosure may include a first logic structure W1, a stacked structure ST, and a second logic structure W2. The stacked structure ST may include a cell area CAR and a connection area EXT. The stacked structure ST may be bonded to the first logic structure W1. The second logic structure W2 may be bonded to the stacked structure ST. A first interface IF1 may be formed between the first logic structure W1 and the stacked structure ST, and a second interface IF2 may be formed between the stacked structure ST and the second logic structure W2. In an embodiment, the connection area EXT may be referred to as a slim or slim area. A first direction FD and a second direction VD may be defined. The first direction FD may be parallel to the upper and lower surfaces of a first substrate 121 and a second substrate 221. The second direction VD may cross the first direction FD. The second direction VD may be perpendicular to the upper and lower surfaces of the first substrate 121 and the second substrate 221.

The first logic structure W1 may include a first substrate 121, a lower device isolation layer 123, a lower insulating layer 125, a plurality of lower transistors 151, 152, 153, 154, 155, 156, 157 and 158, a plurality of lower lines 161, and a plurality of first bonding pads 184. The second logic structure W2 may include a second substrate 221, an upper device isolation layer 223, an upper insulating layer 225, a plurality of upper transistors 251, 252, 253, 254, 255, and 256, a plurality of upper lines 261 and a plurality of second bonding pads 286.

The stacked structure ST may include a first stacked structure ST1, a second stacked structure ST2, a first insulating layer 52, a plurality of first intermediate lines 53, and a plurality of lower bonding pads 54, a common source line 61, a source insulating layer 62, a second insulating layer 64, a plurality of second intermediate lines 65, a plurality of upper bonding pads 66, a plurality of channel structures 79, a plurality of contact spacers 80S, and a plurality of through electrodes 81, 82, 83, 84, 85 and 86. In an embodiment, each of the plurality of through electrodes 81, 82, 83, 84, 85 and 86 may be a high aspect ratio contact (HARC) having an aspect ratio of 10:1 or greater.

The first stacked structure ST1 may include a plurality of first interlayer insulating layers 33, a plurality of first horizontal line layers 37, a plurality of connection pads RP, and a first buried insulating layer 39. The plurality of first interlayer insulating layers 33 and the plurality of first horizontal lines layers 37 may be alternately stacked. The first stacked structure ST1 may be disposed between the second stacked structure ST2 and the second interface IF2.

The second stacked structure ST2 may include a plurality of second interlayer insulating layers 44, a plurality of second horizontal line layers 48, a plurality of connection pads RP, a second buried insulating layer 49, and a plurality of drain plugs 78. The plurality of second interlayer insulating layers 44 and a plurality of second horizontal line layers 48 may be alternately stacked. The second stacked structure ST2 may be disposed between the first stacked structure ST1 and the first interface IF1.

The plurality of lower transistors 151, 152, 153, 154, 155, 156, 157 and 158 may be disposed between the first substrate 121 and the stacked structure ST. Each of the plurality of first bonding pads 184 may be connected to a corresponding one of the plurality of lower transistors 151, 152, 153, 154, 155, 156, 157 and 158 through a plurality of lower lines 161. Each of the plurality of lower bonding pads 54 may be selectively connected to a corresponding one of the plurality of through electrodes 81, 82, 83, 84, 85 and 86 or one or the plurality of channel structures 79 through the plurality of first intermediate lines 53. The plurality of first bonding pads 184 and the plurality of lower bonding pads 54 may be disposed adjacent to the first interface IF1. The plurality of lower bonding pads 54 may directly contact the plurality of first bonding pads 184.

The plurality of upper transistors 251, 252, 253, 254, 255 and 256 may be disposed between the second substrate 221 and the stacked structure ST. Each of the plurality of upper bonding pads 66 may be selectively connected to a corresponding one of the plurality of through electrodes 81, 82, 83, 84, 85 and 86 through a plurality of second intermediate lines 65. Each of the plurality of second bonding pads 286 may be connected to a corresponding one of the plurality of upper transistors 251, 252, 253, 254, 255 and 256 through the plurality of upper lines 261. The plurality of upper bonding pads 66 and the plurality of second bonding pads 286 may be disposed adjacent to the second interface IF2. The plurality of second bonding pads 286 may directly contact the plurality of upper bonding pads 66.

Each of the plurality of through electrodes 81, 82, 83, 84, 85 and 86 may extend in the second direction VD within the connection area EXT. Each of the plurality of through electrodes 81, 82, 83, 84, 85 and 86 may be spaced apart from each other. Each of the plurality of through electrodes 81, 82, 83, 84, 85 and 86 may completely penetrate or completely pass through the first and second stacked structures ST1 and ST2 in the second direction VD. Each of the plurality of through electrodes 81, 82, 83, 84, 85 and 86 may completely penetrate or completely pass through the plurality of first interlayer insulating layers 33, the plurality of first horizontal line layers 37, the plurality of second interlayer insulating layers 44, and the plurality of second horizontal line layers 48. Each of the plurality of contact spacers 80S may surround side surfaces of the plurality of through electrodes 81, 82, 83, 84, 85 and 86. Upper ends or top ends of the plurality of through electrodes 81, 82, 83, 84, 85 and 86, of the plurality of contact spacers 80S, of the plurality of channel structures 79, and of the plurality of first interlayer insulating layers 33 may be common to substantially the same first plane. Lower ends or lowermost ends of the plurality of through electrodes 81, 82, 83, 84, 85 and 86 and of the plurality of contact spacers 80S may be common to substantially the same second plane. In an embodiment, the first plane and second plane are parallel to each other and spaced apart in the second direction VD.

Each of the plurality of channel structures 79 may extend in the second direction VD within the cell area CAR. Each of the plurality of channel structures 79 may completely pass through the first and second stacked structures ST1 and ST2 in the second direction VD. Each of the plurality of channel structures 79 may completely pass through the plurality of first interlayer insulating layers 33, the plurality of first horizontal line layers 37, the plurality of second interlayer insulating layers 44, and the plurality of second horizontal line layers 48. The common source line 61 contacting the plurality of channel structures 79 may be disposed on the plurality of first interlayer insulating layers 33 in the cell area CAR. A lower surface of the common source line 61 may directly contact top surfaces of the plurality of first interlayer insulating layers 33 and top surfaces of the plurality of channel structures 79. The lower surface of the common source line 61 may be formed on substantially the same first plane as the uppermost ends of the plurality of through electrodes 81, 82, 83, 84, 85 and 86, of the plurality of contact spacers 80S, of the plurality of channel structures 79, and the plurality of first interlayer insulating layers 33. A plurality of memory cells MC may be formed at intersections of the plurality of channel structures 79 and the plurality of first horizontal line layers 37, and at intersections of the plurality of channel structures 79 and the plurality of second horizontal line layers 48.

Each of the plurality of first horizontal line layers 37 and the plurality of second horizontal line layers 48 may extend within the connection area EXT along the first direction FD and into the cell area CAR. The plurality of connection pads RP may be disposed in the connection area EXT. In an embodiment, each of the plurality of connection pads RP may be connected to a lower surface of one of the plurality of first horizontal line layers 37 or one of the plurality of second horizontal line layers 48. The plurality of connection pads RP, the plurality of first interlayer insulating layers 33, the plurality of first horizontal line layers 37, the plurality of second interlayer insulating layers 44, and the plurality of second horizontal line layers 48 may form a staircase or a stepped shape along the first direction FD.

The first buried insulating layer 39 may cover a stepped shape or staircase structure in the connection area EXT that includes a plurality of connection pads RP, a plurality of first interlayer insulating layers 33, and a plurality of first horizontal line layers 37. A stepped shape in the first stacked structure ST1 may be discontinuous with respect to a stepped shape in the second stacked structure ST2. The second buried insulating layer 49 may cover a stepped shape in the connection area EXT that includes a plurality of connection pads RP, a plurality of second interlayer insulating layers 44, and a plurality of second horizontal line layers 48.

A first through electrode 81 and a second through electrode 82 may be adjacent to each other. The first through electrode 81 and the second through electrode 82 may pass through the plurality of second interlayer insulating layers 44, the plurality of second horizontal line layers 48, the first buried insulating layer 39, connection pads RP, the plurality of first interlayer insulating layers 33, and a plurality of first horizontal line layers 37. Each of the first through electrode 81 and the second through electrode 82 may be connected to a different first horizontal line layer 37 through a corresponding connection pads RP. For example, one of the plurality of connection pads RP in contact with a first horizontal line layer 37 may pass through the contact spacer 80S and directly contact the side surface of the first through electrode 81, and another one of the plurality of connection pads RP in contact with a different first horizontal line layer 37 may pass through the contact spacer 80S and directly contact the side surface of the second through electrode 82.

A third through electrode 83 and a fourth through electrode 84 may be adjacent to each other. The third through electrode 83 and the fourth through electrode 84 may penetrate or pass through the second buried insulating layer 49, connection pads RP, the plurality of second interlayer insulating layers 44, the plurality of second horizontal line layers 48, the plurality of first interlayer insulating layers 33, and the plurality of first horizontal line layers 37. Each of the third through electrode 83 and the fourth through electrode 84 may be connected to a different second horizontal line layer 48 through a corresponding connection pads RP. For example, one of the plurality of connection pads RP in contact with a second horizontal line layer 48 may pass through the contact spacer 80S and directly contact a side surface of the third through electrode 83, and another one of the plurality of connection pads RP in contact with a different second horizontal line layer 48 may pass through the contact spacer 80S and directly contact the side surface of the fourth through electrode 84.

A fifth through electrode 85 and a sixth through electrode 86 may be adjacent to each other. The fifth through electrode 85 and the sixth through electrode 86 may pass through the plurality of second interlayer insulating layers 44, the plurality of second horizontal line layers 48, the plurality of first interlayer insulating layers 33, and the plurality of first horizontal line layers 37. Each of the fifth through electrode 85 and the sixth through electrode 86 may be insulated from the plurality of second horizontal line layers 48 and the plurality of first horizontal line layers 37 by a contact spacer 80S.

Each of the plurality of lower transistors 151, 152, 153, 154, 155, 156, 157 and 158, and the plurality of upper transistors 251, 252, 253, 254, 255 and 256 may include NMOS transistors or PMOS transistors. Each of the plurality of lower transistors 151, 152, 153, 154, 155, 156, 157 and 158, and the plurality of upper transistors 251, 252, 253, 254, 255, and 256 may include a gate electrode GE and a pair of source/drain areas SD. Each of the plurality of lower transistors 151, 152, 153, 154, 155, 156, 157 and 158, and the plurality of upper transistors 251, 252, 253, 254, 255 and 256 may include a planar transistor, a recess channel transistor, a vertical transistor, fin field effect transistor (finFET), a gate-all-around (GAA) transistor, a multi-bridge channel transistor, or combinations thereof.

Each of the first to sixth lower transistors 151, 152, 153, 154, 155 and 156 may be arranged adjacent to a lower end of a corresponding one of the plurality of through electrodes 81, 82, 83, 84, 85 and 86. Each of the first to sixth upper transistors 251, 252, 253, 254, 255 and 256 may be arranged adjacent to the upper end of a corresponding one of the plurality of through electrodes 81, 82, 83, 84, 85 and 86.

Each of the first to fourth lower transistors 151, 152, 153 and 154, and the first to fourth upper transistors 251, 252, 253 and 254 may correspond to a pass transistor. A plurality of pass transistors may be arranged and distributed in the first logic structure W1 and the second logic structure W2. In an embodiment, the first to fourth lower transistors 151, 152, 153 and 154 may be a first pass transistor group. Each of the first to fourth lower transistors 151, 152, 153 and 154 may be referred to as a lower pass transistor. The first to fourth upper transistors 251, 252, 253 and 254 may be a second pass transistor group. Each of the first to fourth upper transistors 251, 252, 253 and 254 may be referred to as an upper pass transistor.

One of the pair of source/drain areas SD of the first lower transistor 151 may be electrically connected to the lower end of the first through electrode 81 via a plurality of lower lines 161, the corresponding one of the plurality of first bonding pads 184, the corresponding one of the plurality of lower bonding pads 54, and a plurality of first intermediate lines 53. In an embodiment, the second lower transistor 152 may be aligned adjacent to a lower end of the second through electrode 82. The second lower transistor 152 may be insulated from the second through electrode 82. The second lower transistor 152 may correspond to a dummy transistor or an inactive transistor. In an embodiment, the second lower transistor 152 may be connected to electrodes other than the first to fourth through electrodes 81, 82, 83 and 84.

One of the pair of source/drain areas SD of the third lower transistor 153 may be electrically connected to the lower end of the third through electrode 83 via a plurality of lower lines 161, the corresponding one of the plurality of first bonding pads 184, the corresponding one of the plurality of lower bonding pads 54, and a plurality of first intermediate lines 53. In an embodiment, the fourth lower transistor 154 may be aligned adjacent to a lower end of the fourth through electrode 84. The fourth lower transistor 154 may be insulated from the fourth through electrode 84. The fourth lower transistor 154 may correspond to a dummy transistor or an inactive transistor. In an embodiment, the fourth lower transistor 154 may be connected to electrodes other than the first to fourth through electrodes 81, 82, 83 and 84.

In an embodiment, between the second lower transistor 152 and the second through electrode 82, and between the fourth lower transistor 154 and the fourth through electrode 84, there may be selectively omitted a plurality of lower lines 161, a plurality of first bonding pads 184, a plurality of lower bonding pads 54, and a plurality of first intermediate lines 53. Densities of the plurality of lower lines 161, the plurality of first bonding pads 184, the plurality of lower bonding pads 54 and the plurality of first intermediate line 53 may be reduced. In an embodiment, the second lower transistor 152 and the fourth lower transistor 154 may be selectively omitted. Densities of the first lower transistor 151 and the third lower transistor 153 may be reduced.

One of the pair of source/drain areas SD of the first upper transistor 251 may be electrically connected to the upper end of the second through electrode 82 through a plurality of upper lines 261, the corresponding one of the plurality of second bonding pads 286, the corresponding one of the plurality of upper bonding pads 66 and a plurality of second intermediate lines 65. In an embodiment, the second upper transistor 252 may be aligned adjacent to an upper end of the first through electrode 81. The second upper transistor 252 may be insulated from the first through electrode 81. The second upper transistor 252 may correspond to a dummy transistor or an inactive transistor. In an embodiment, the second upper transistor 252 may be connected to electrodes other than the first to fourth through electrodes 81, 82, 83 and 84.

One of the pair of source/drain areas SD of the third upper transistor 253 may be electrically connected to an upper end of the fourth through electrode 84 through a plurality of upper lines 261, the corresponding one of the plurality of second bonding pads 286, the corresponding one of the plurality of upper bonding pads 66 and a plurality of second intermediate lines 65. In an embodiment, the fourth upper transistor 254 may be aligned adjacent to an upper end of the third through electrode 83. The fourth upper transistor 254 may be insulated from the third through electrode 83. The fourth upper transistor 254 may correspond to a dummy transistor or an inactive transistor. In an embodiment, the fourth upper transistor 254 may be connected to electrodes other than the first to fourth through electrodes 81, 82, 83 and 84.

In an embodiment, between the second upper transistor 252 and the first through electrode 81, and between the fourth upper transistor 254 and the third through electrode 83, there may be selectively omitted a plurality of upper lines 261, the plurality of second bonding pads 286, the plurality of upper bonding pads 66, and a plurality of second intermediate lines 65. The second upper transistor 252 and the fourth upper transistor 254 may be selectively omitted.

The fifth and sixth lower transistors 155 and 156 and the fifth and sixth upper transistors 255 and 256 may be a block selection circuit. At least one of the first logic structure W1 and the second logic structure W2 may include a block selection circuit. Each of the fifth and sixth lower transistors 155 and 156 and the fifth and sixth upper transistors 255 and 256 may correspond to a block selection transistor. In an embodiment, a plurality of block selection transistors may be disposed and distributed within the first logic structure W1 and the second logic structure W2. The fifth and sixth lower transistors 155 and 156 and the fifth and sixth upper transistors 255 and 256 may be selectively omitted. For example, the sixth lower transistor 156 and the sixth upper transistor 256 may be omitted.

In an embodiment, at least one of the fifth and sixth lower transistors 155 and 156 and the fifth and sixth upper transistors 255 and 256 may be electrically connected to one or more of the first to fourth lower transistors 151, 152, 153 and 154, and, at the same time, may be electrically connected to one or more of the first to fourth upper transistors 251, 252, 253 and 254 through the fifth and sixth through electrodes 85 and 86.

In an embodiment, one of the pair of source/drain areas SD of each of the fifth and sixth lower transistors 155 and 156 may be electrically connected to a lower end of a corresponding one of the fifth and sixth through electrodes 85 and 86 through a plurality of lower lines 161, the corresponding one of the plurality of first bonding pads 184, the corresponding one of the plurality of lower bonding pads 54, and a plurality of first intermediate lines 53. One of the pair of source/drain areas SD of each of the fifth and sixth upper transistors 255 and 256 may be electrically connected to an upper end of a corresponding one of the fifth and sixth through electrodes 85 and 86 through a plurality of upper lines 261, the corresponding one of the plurality of second bonding pads 286, the corresponding one of the plurality of upper bonding pads 66, and a plurality of second intermediate lines 65.

In an embodiment, a lower end of the fifth through electrode 85 may be electrically connected to the gate electrodes GE of the first and third lower transistors 151 and 153 through a plurality of lower lines 161, the plurality of first bonding pads 184, the plurality of lower bonding pads 54 and a plurality of first intermediate lines 53. The upper end of the fifth through electrode 85 may be electrically connected to the gate electrodes GE of the first and third upper transistors 251 and 253 through a plurality of upper lines 261, the plurality of second bonding pads 286, the plurality of upper bonding pads 66, and a plurality of second intermediate lines 65.

The seventh and eighth lower transistors 157 and 158 may be a page buffer circuit. One of the pair of source/drain areas SD of each of the seventh and eighth lower transistors 157 and 158 may be connected to a drain plug 78 of a corresponding one of the plurality of channel structures 79 through a plurality of lower lines 161, the corresponding one of the plurality of first bonding pads 184, the corresponding one of the plurality of lower bonding pads 54, and a plurality of first intermediate lines 53.

Figure 3:
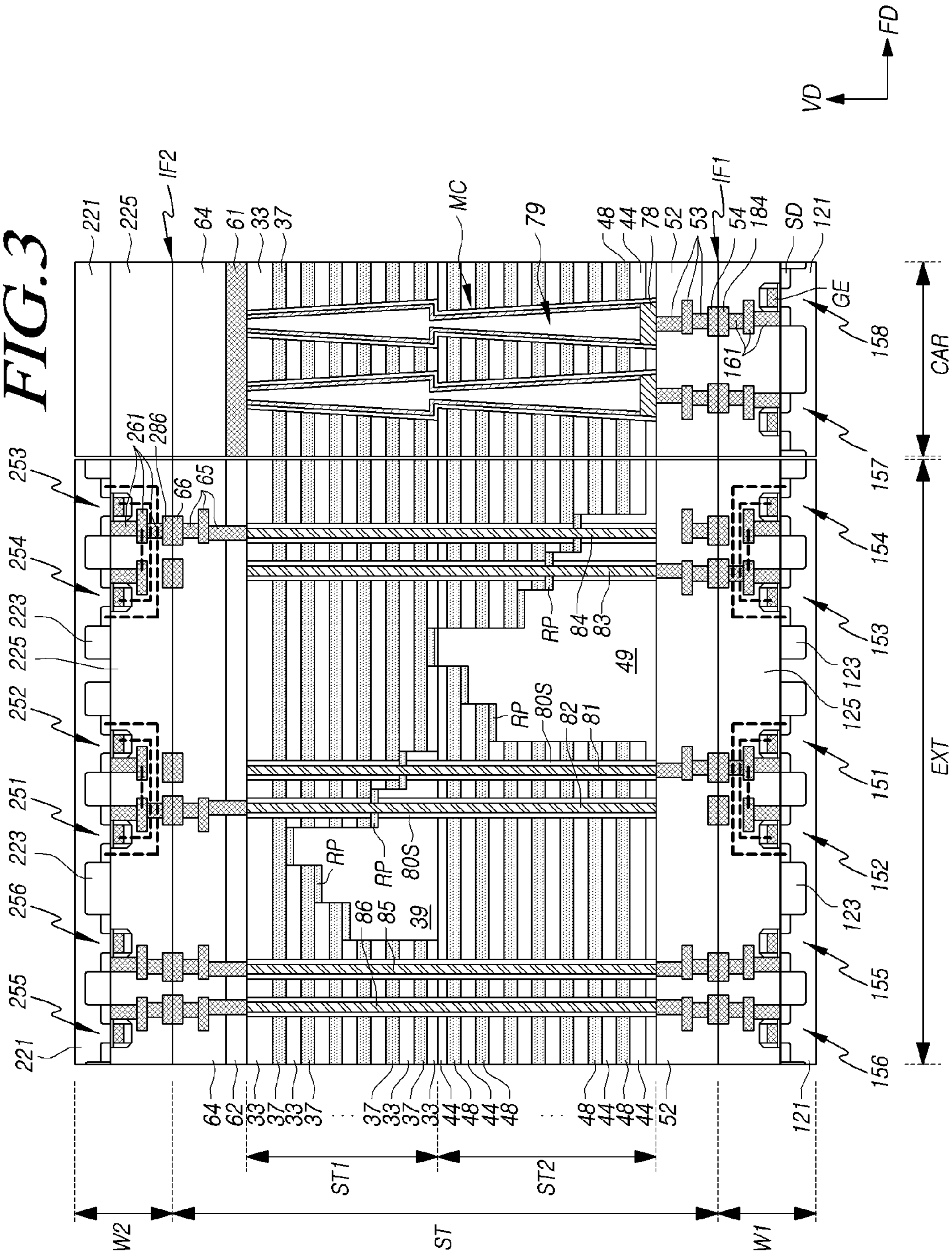

Referring to FIG. 3, in an embodiment, the first lower transistor 151 may be connected in parallel with the second lower transistor 152, the third lower transistor 153 may be connected in parallel with the fourth lower transistor 154, the first upper transistor 251 may be connected in parallel with the second upper transistor 252, and the third upper transistor 253 may be connected in parallel with the fourth upper transistor 254. For example, the gate electrode GE of the first lower transistor 151 may be connected to the gate electrode GE of the second lower transistor 152, and each of the pair of source/drain areas SD of the first lower transistor 151 may be connected to a corresponding one of the pair of source/drain areas SD of the second lower transistor 152. There may be increased current driving capability applied to each of the first to fourth through electrodes 81, 82, 83 and 84.

Each of the plurality of lower transistors 151, 152, 153, 154, 155, 156, 157 and 158, the plurality of lower lines 161, the plurality of first bonding pads 184, the plurality of first intermediate lines 53, the plurality of lower bonding pads 54, the plurality of second intermediate lines 65, the plurality of upper bonding pads 66, the plurality of upper transistors 251, 252, 253, 254, 255 and 256, the plurality of upper lines 261, and the plurality of second bonding pads 286 may be arranged in various ways to manage line density or wiring density. For example, some of the plurality of lower lines 161, the plurality of first bonding pads 184, the plurality of first intermediate lines 53, the plurality of lower bonding pads 54, the plurality of second intermediate lines 65, the plurality of upper bonding pads 66, the plurality of upper lines 261, and the plurality of second bonding pads 286 may be selectively omitted. The line densities in the first logic structure W1, the stacked structure ST, and the second logic structure W2 may be reduced.

Figure 4:
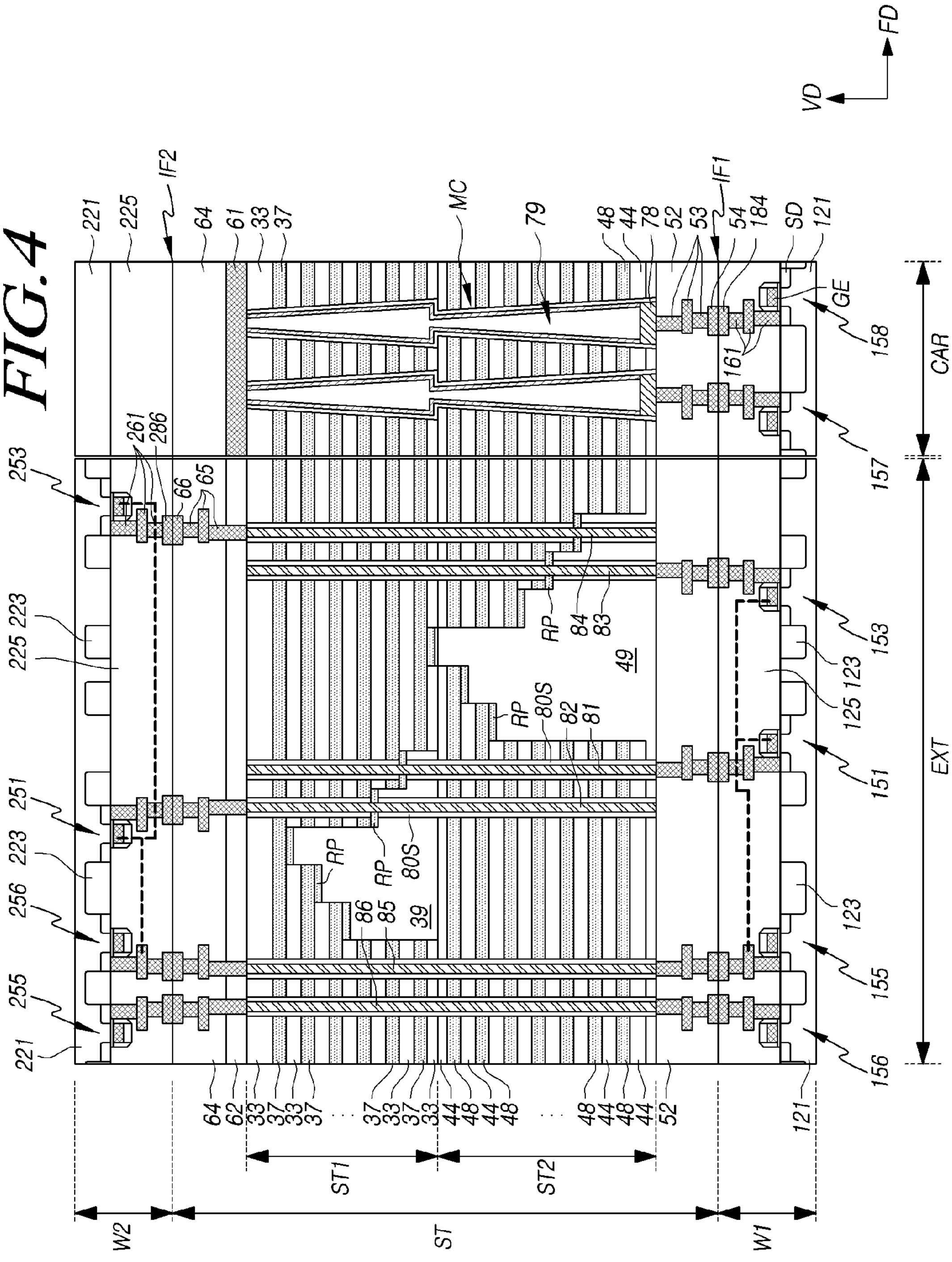

Referring to FIG. 4, in an embodiment, a second lower transistor (152 in FIG. 1), a fourth lower transistor (154 in FIG. 1), a second upper transistor (252 in FIG. 1), and a fourth upper transistor (254 in FIG. 1) may be omitted. The plurality of lower lines 161, the plurality of first bonding pads 184, the plurality of first intermediate lines 53, the plurality of lower bonding pads 54, the plurality of second intermediate lines 65, the plurality of upper bonding pads 66, the plurality of upper lines 261, and the plurality of second bonding pads 286 may be variously arranged to control line density. The line densities in the first logic structure W1, the stacked structure ST, and the second logic structure W2 may be reduced.

Figure 5:
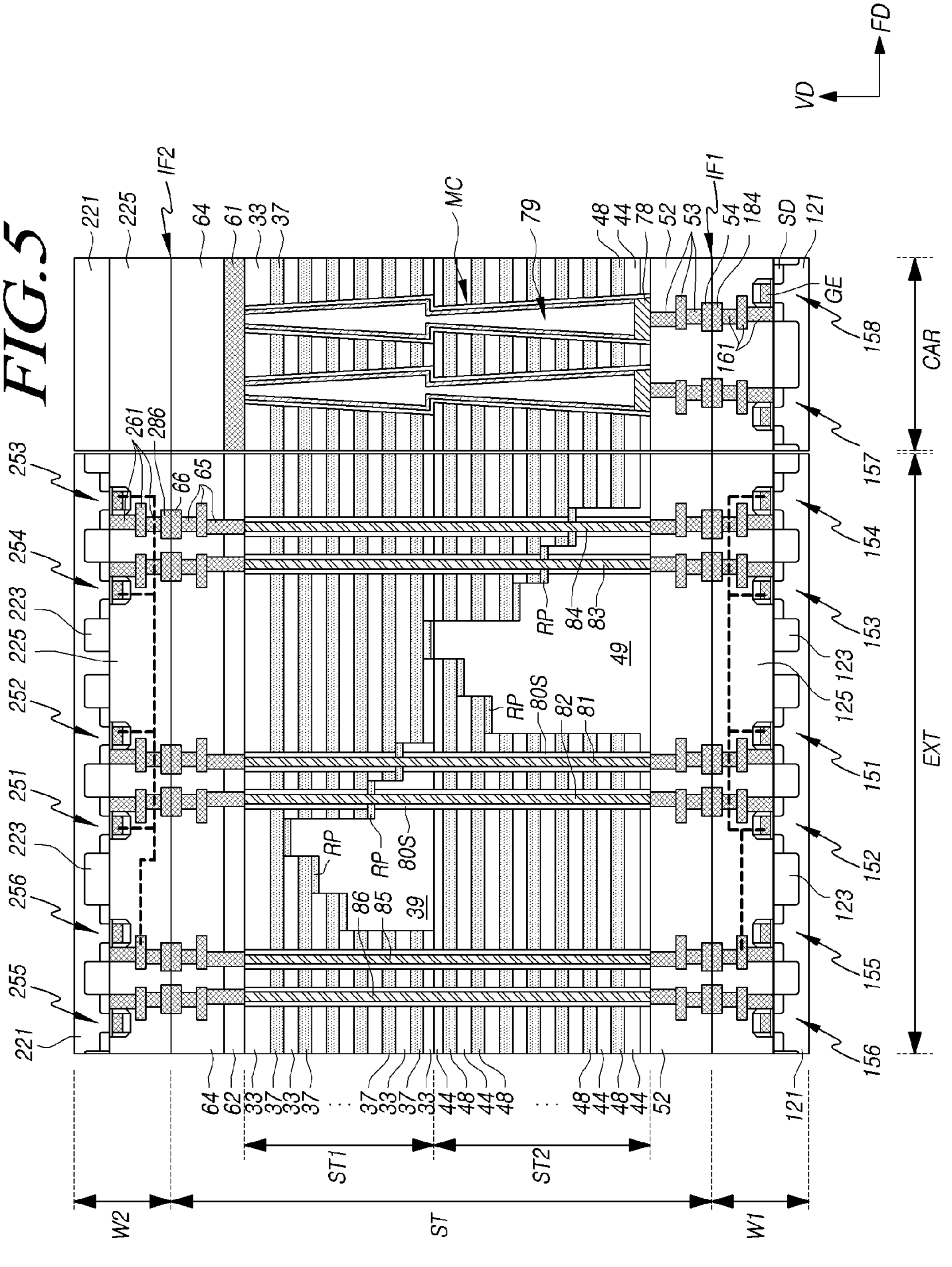

Referring to FIG. 5, one of the pair of source/drain areas SD of the first lower transistor 151 may be electrically connected to the lower end of the first through electrode 81 through a plurality of lower lines 161, the corresponding one of the plurality of first bonding pads 184, the corresponding one of the plurality of lower bonding pads 54, and a plurality of first intermediate lines 53. The second to fourth lower transistors 152, 153 and 154 may be electrically connected to lower ends of the second to fourth through electrodes 82, 83 and 84 respectively in a similar manner.

One of the pair of source/drain areas SD of the first upper transistor 251 may be electrically connected to the upper end of the second through electrode 82 through a plurality of upper lines 261, the corresponding one of the plurality of second bonding pads 286, the corresponding one of the plurality of upper bonding pads 66, and a plurality of second intermediate lines 65. Similarly, the second upper transistor 252 may be electrically connected to the upper end of the first through electrode 81, and the third upper transistor 253 may be electrically connected to the upper end of the fourth through electrode 84, and the fourth upper transistor 254 may be electrically connected to an upper end of the third through electrode 83. There may be increased current driving capability applied to each of the first to fourth through electrodes 81, 82, 83 and 84.

Each of the fifth and sixth lower transistors 155 and 156 and the fifth and sixth upper transistors 255 and 256 may correspond to a block selection transistor. The fifth and sixth lower transistors 155 and 156 and the fifth and sixth upper transistors 255 and 256 may be a block selection circuit. Similar to the description above with reference to FIG. 1, each of the fifth and sixth lower transistors 155 and 156 and the fifth and sixth upper transistors 255 and 256 may be electrically connected to a corresponding one of the fifth and sixth through electrodes 85 and 86.

In an embodiment, a lower end of the fifth through electrode 85 may be electrically connected to the gate electrodes GE of the first to fourth lower transistors 151, 152, 153 and 154 through a plurality of lower lines 161, a plurality of first bonding pads 184, a plurality of lower bonding pads 54 and a plurality of first intermediate lines 53. The upper end of the fifth through electrode 85 may be electrically connected to gate electrodes GE of the first to fourth upper transistors 251, 252, 253 and 254 through a plurality of upper lines 261, a plurality of second bonding pads 286, a plurality of upper bonding pads 66, and a plurality of second intermediate lines 65. The first to fourth lower transistors 151, 152, 153 and 154 and the first to fourth upper transistors 251, 252, 253 and 254 may be turned on and turned off simultaneously by the fifth lower transistor 155 and/or the sixth upper transistor 256.

Figure 6:
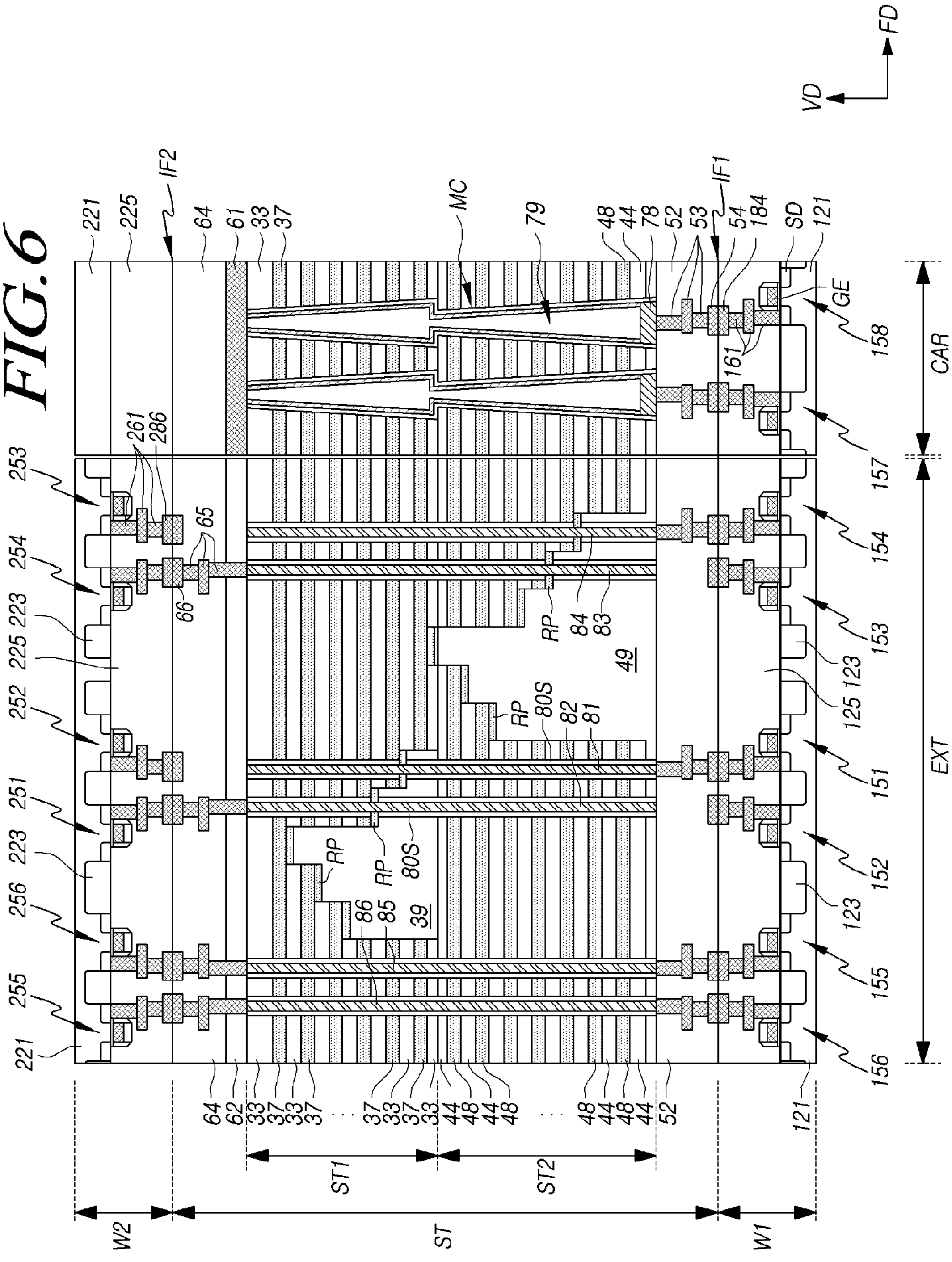

Referring to FIG. 6, each of the plurality of lower transistors 151, 152, 153, 154, 155, 156, 157 and 158, the plurality of lower lines 161, the plurality of first bonding pads 184, the plurality of a plurality of first intermediate lines 53, the plurality of lower bonding pads 54, the plurality of second intermediate lines 65, the plurality of upper bonding pads 66, the plurality of upper transistors 251, 252, 253, 254, 255 and 256, the plurality of upper lines 261, and a plurality of second bonding pads 286 may be arranged in various ways to manage or control line density. In an embodiment, the fourth lower transistor 154 may be connected to a lower end of the fourth through electrode 84. The third lower transistor 153 may be insulated from the third through electrode 83. The fourth upper transistor 254 may be connected to an upper end of the third through electrode 83. The third upper transistor 253 may be insulated from the fourth through electrode 84.

In an embodiment, the plurality of first horizontal line layers 37 and the plurality of second horizontal line layers 48 may include a plurality of odd-numbered line layers and a plurality of even-numbered line layers that are alternately stacked. Some of the plurality of odd-numbered line layers may be connected to corresponding ones of the first to fourth lower transistors 151, 152, 153 and 154 via some of the first to fourth through electrodes 81, 82, 83 and 84. Some of the plurality of even-numbered line layers may be connected to corresponding ones of the first to fourth upper transistors 251, 252, 253 and 254 via other ones of the first to fourth through electrodes 81, 82, 83 and 84.

In an embodiment, adjacent first to fourth through electrodes 81, 82, 83 and 84 may be connected to a transistor at opposite upper and lower ends, i.e., opposite ends in the second direction VD. For example, the first and second through electrodes 81 and 82 may be disposed adjacent to each other. A lower end of the first through electrode 81 may be connected to the first lower transistor 151 in the first logic structure W1, and an upper end of the second through electrode 82 may be connected to the first upper transistor

251 in the second logic structure W2. The third and fourth through electrodes 83 and 84 may be disposed adjacent to each other. An upper end of the third through electrode 83 may be connected to the fourth upper transistor 254 in the second logic structure W2, and a lower end of the fourth through electrode 84 may be connected to the fourth lower transistor 154 in the first logic structure W1.

Figure 7:
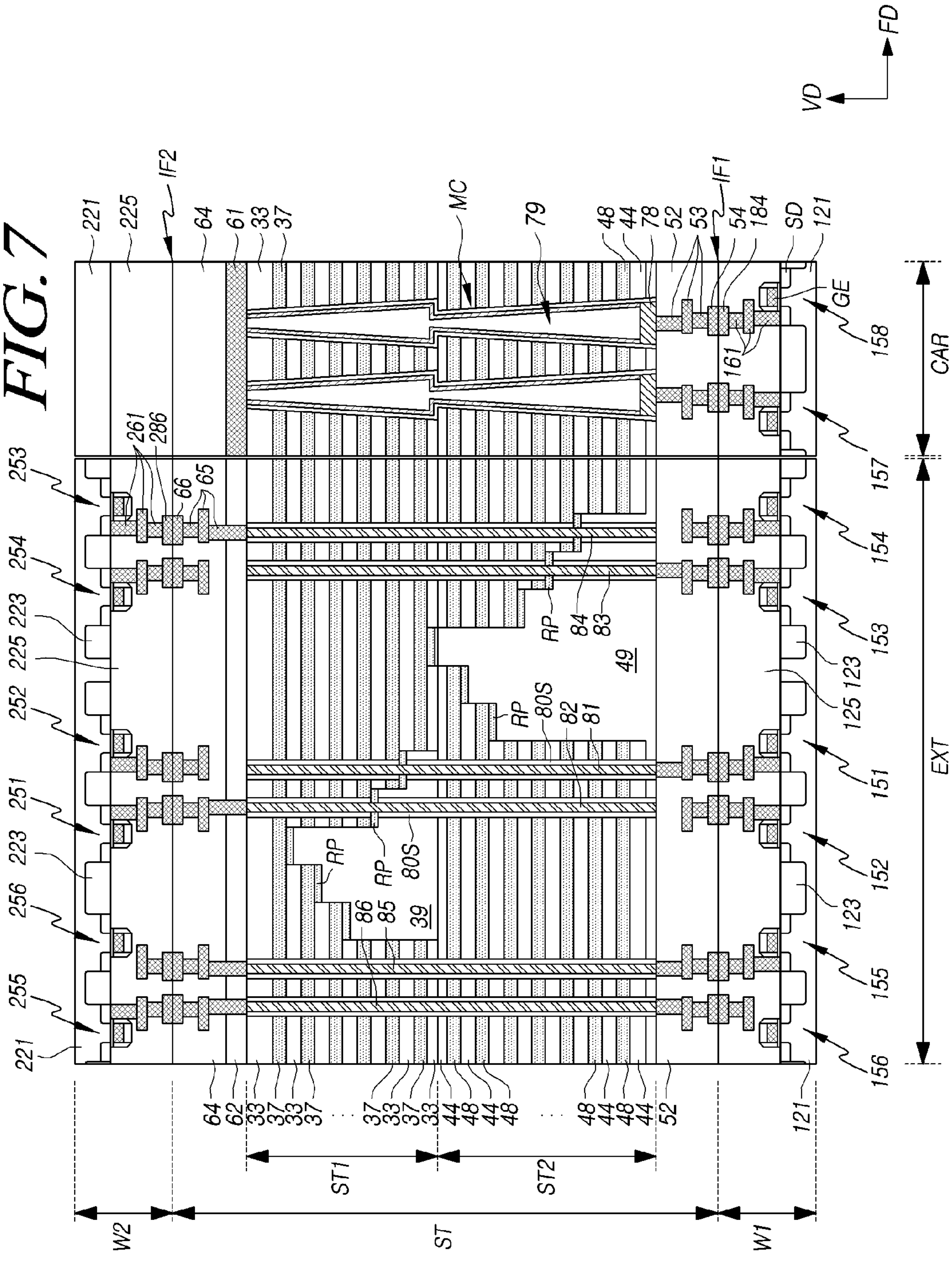

Referring to FIG. 7, the fifth and sixth lower transistors 155 and 156 and the fifth and sixth upper transistors 255 and 256 may be a block selection circuit. Each of the fifth and sixth lower transistors 155 and 156, a plurality of lower lines 161, a plurality of first bonding pads 184, a plurality of first intermediate lines 53, a plurality of lower bonding pads 54, a plurality of second intermediate lines 65, a plurality of upper bonding pads 66, the fifth and sixth upper transistors 255 and 256, a plurality of upper line 261, and a plurality of second bonding pads 286 may be arranged in various ways to manage line density. In an embodiment, the sixth lower transistor 156 may be insulated from the sixth through electrode 86, and the sixth upper transistor 256 may be insulated from the fifth through electrode 85.

Figure 8:
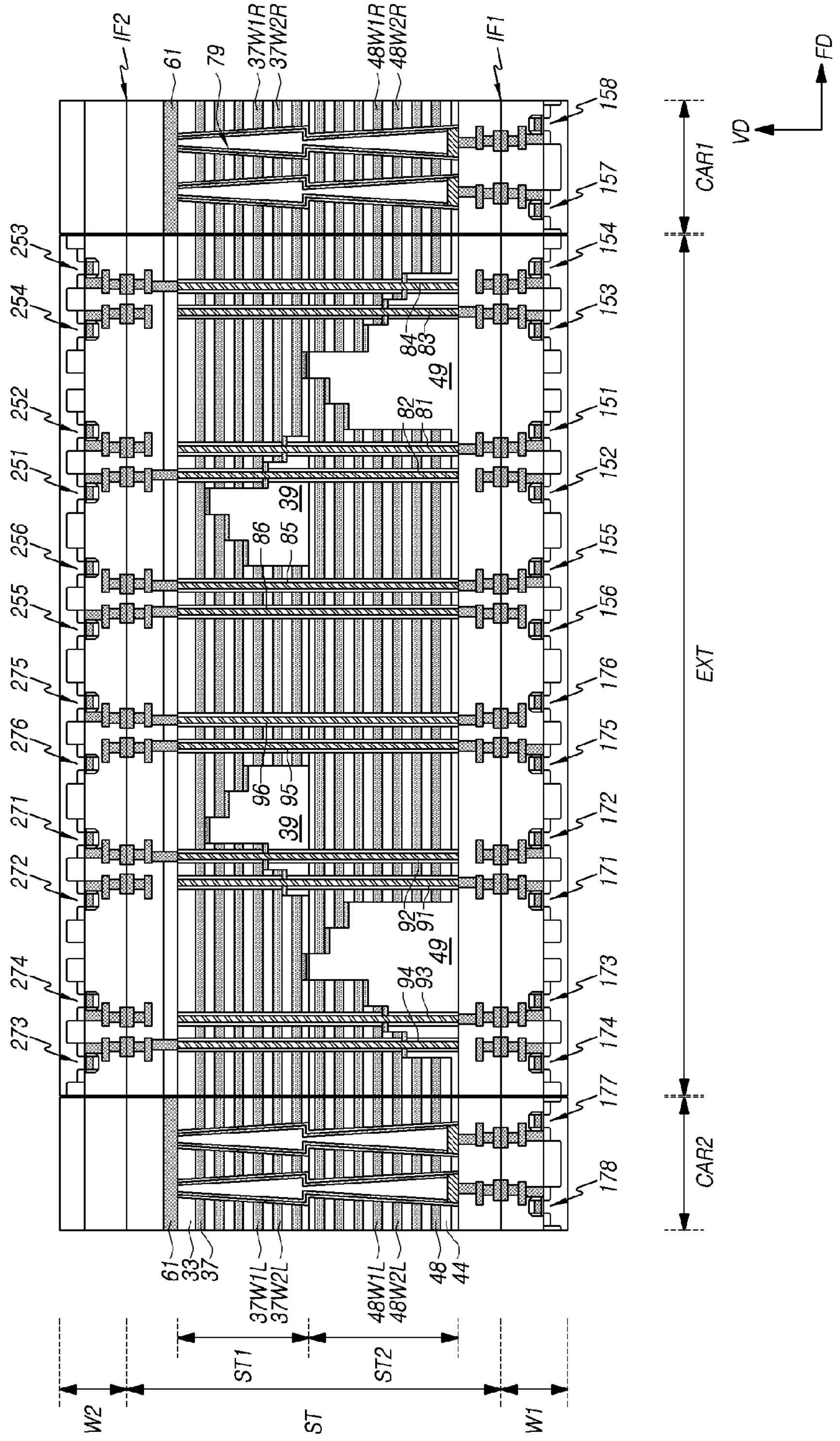
Figure 9:
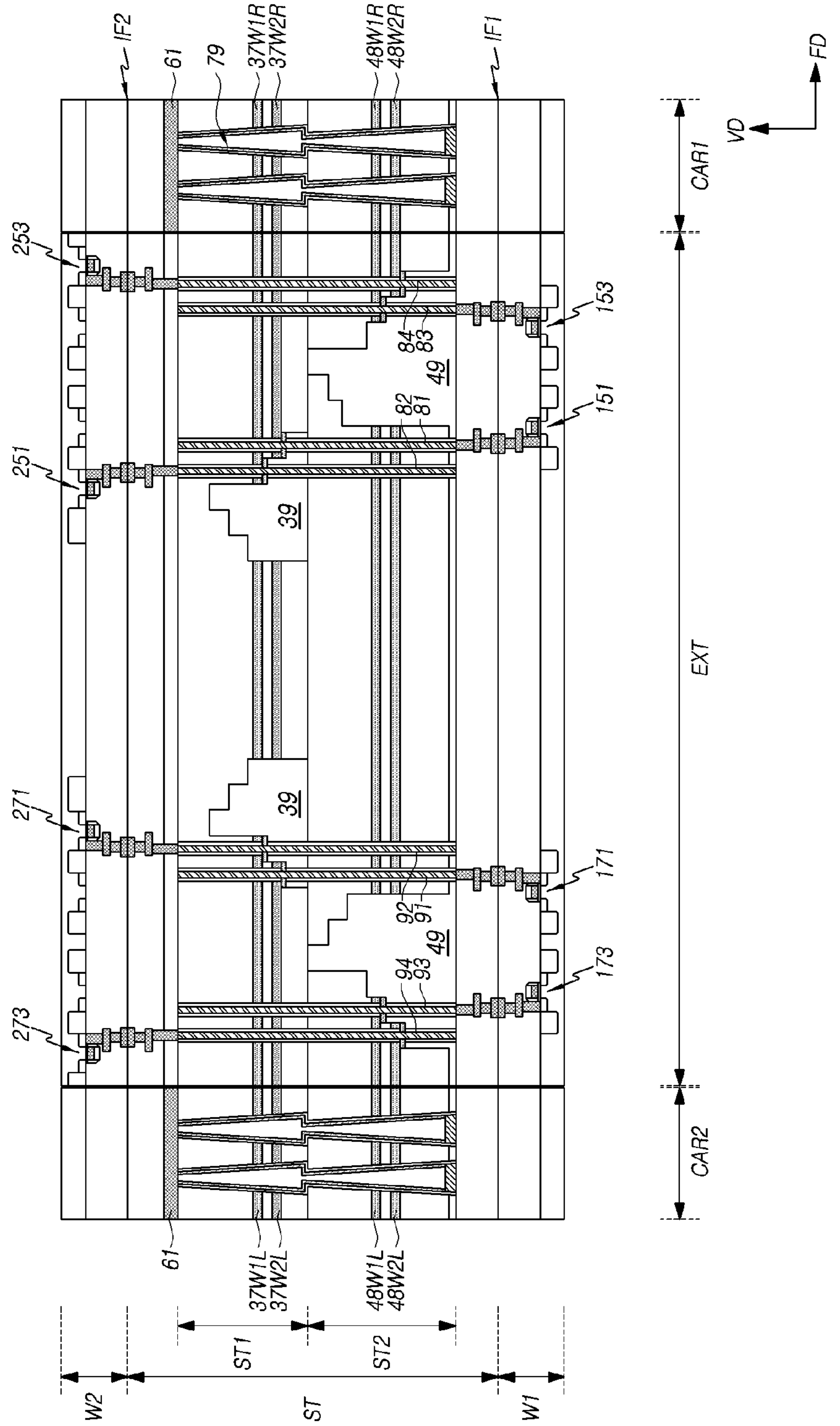
FIG. 9 illustrates a portion of a semiconductor device of FIG. 8.

Referring to FIGS. 8 and 9, a semiconductor device according to an embodiment of the present disclosure may include a shared slim structure. In an embodiment, the stacked structure ST may include a plurality of cell areas CAR1 and CAR2 and a connection area EXT. The plurality of cell areas CAR1 and CAR2 may share the connection area EXT. For example, the connection area EXT may be disposed between a first cell area CAR1 and a second cell area CAR2. The connection area EXT may be referred to as a slim or slim area. Each of the first cell area CAR1 and the second cell area CAR2 may include a plurality of channel structures 79.

The plurality of first horizontal line layers 37, 37W1R, 37W1L, 37W2R, and 37W2L may include a first upper word line right portion 37W1R, a first upper word line left portion 37W1L, a second upper word line right portion 37W2R, and a second upper word line left portion 37W2L. The first upper word line right portion 37W1R and the first upper word line left portion 37W1L may constitute a first upper word line, and the second upper word line right portion 37W2R and the second upper word line left portion 37W2L may constitute a second upper word line. The plurality of second horizontal lines layers 48, 48W1R, 48W1L, 48W2R, and 48W2L may include a first lower word line right portion 48W1R, a first lower word line left portion 48W1L, a second lower word line right portion 48W2R, and a second lower word line left portions 48W2L. The first lower word line right portion 48W1R and the first lower word line left portion 48W1L may constitute a first lower word line, and the second lower word line right portion 48W2R and the second lower word line left portion 48W2L may constitute a second lower word line.

Each of the first and second upper word line right portions 37W1R and 37W2R and the first and second lower word line right portions 48W1R and 48W2R may extend toward the connection area EXT in the first direction FD within the first cell area CAR1. Each of the first and second upper word line left portions 37W1L and 37W2L and the first and second lower word line left portions 48W1L and 48W2L may extend toward the connection area EXT within the second cell area CAR2 in the first direction FD. Each of the first and second upper word line right portions 37W1R and 37W2R and the first and second lower word line right portions 48W1R and 48W2R may be connected to a corresponding one of the first and second upper word line left portions 37W1L and 37W2L and the first and second lower word line left portions 48W1L and 48W2L through respective first horizontal line layers 37 and second horizontal line layers 48 in the connection area EXT. Each of the first and second upper word line right portions 37W1R and 37W2R and first and second lower word line right portions 48W1R and 48W2R may be disposed at substantially the same level as a corresponding one of the first and second upper word line left portions 37W1L and 37W2L and the first and second lower word line left portions 48W1L and 48W2L. For example, the first upper word line right portion 37W1R may be disposed at substantially the same level as the first upper word line left portion 37W1L in the second direction VD. Similarly, the first upper word line right portion 37W1R may be connected to the first upper word line left portion 37W1L through the connection area EXT.

Each of the first to fourth through electrodes 81, 82, 83 and 84 may be connected to a corresponding one of the first and second upper word line right portions 37W1R and 37W2R and the first and second lower word line right portions 48W1R and 48W2R. Each of the seventh to tenth through electrodes 91, 92, 93 and 94 may be connected to a corresponding one of the first and second upper word line left portions 37W1L and 37W2L and the first and second lower word line left portions 48W1L and 48W2L. For example, the first through electrode 81 may be connected to the second upper word line right portion 37W2R, and the seventh through electrode 91 may be connected to the second upper word line left portion 37W2L. The second through electrode 82 may be connected to the right portion of the first upper word line right portion 37W1R, and the eighth through electrode 92 may be connected to the left portion of the first upper word line left portion 37W1L.

Each of the first to fourth lower transistors 151, 152, 153, and 154, the ninth to twelfth lower transistors 171, 172, 173 and 174, the first to fourth upper transistors 251, 252, 253 and 254, and the seventh to tenth upper transistors 271, 272, 273 and 274 may correspond to a pass transistor. In an embodiment, the first to fourth lower transistors 151, 152, 153 and 154, and the ninth to twelfth lower transistors 171, 172, 173 and 174 may be a first pass transistor group. The first to fourth upper transistors 251, 252, 253 and 254, and the seventh to tenth upper transistors 271, 272, 273 and 274 may be a second pass transistor group. Each of the first to fourth through electrodes 81, 82, 83 and 84, and the seventh to tenth through electrodes 91, 92, 93 and 94 may be connected to the at least one of the corresponding first to fourth lower transistors 151, 152, 153 and 154, the ninth to twelfth lower transistors 171, 172, 173 and 174, the first to fourth upper transistors 251, 252, 253 and 254, and the seventh to tenth upper transistors 271, 272, 273 and 274.

The fifth and sixth lower transistors 155 and 156, the thirteenth and fourteenth lower transistors 175 and 176, the fifth and sixth upper transistors 255 and 256, and the eleventh and twelfth upper transistors 275 and 276 may be a block selection circuit. Each of the fifth and sixth lower transistors 155 and 156, the thirteenth and fourteenth lower transistors 175 and 176, the fifth and sixth upper transistors 255 and 256, and the eleventh and twelfth upper transistors 275, 276 may correspond to block selection transistors. Each of the fifth and sixth through electrodes 85 and 86, and the eleventh and twelfth through electrodes 95 and 96 may be connected to at least one corresponding one of the fifth and sixth lower transistors 155 and 156, the thirteenth and fourteenth lower transistors 175 and 176, the fifth and sixth upper transistors 255 and 256, and the eleventh and twelfth upper transistors 275 and 276.

In an embodiment, at least one of the fifth and sixth lower transistors 155 and 156, the thirteenth and fourteenth lower transistors 175 and 176, the fifth and sixth upper transistors 255 and 256, and the eleventh and twelfth upper transistors 275 and 276 may be electrically connected to one or more of the first to fourth lower transistors 151, 152, 153 and 154 and the ninth to twelfth lower transistors 171, 172, 173 and 174 through at least one of the corresponding fifth and sixth through electrodes 85 and 86 and the eleventh and twelfth through electrodes 95 and 96, and, at the same time, may be electrically connected to one or more of the first to fourth upper transistors 251, 252, 253 and 254 and the seventh to tenth upper transistors 271, 272, 273 and 274.

In an embodiment, at least one of the fifth and sixth lower transistors 155 and 156, the thirteenth and fourteenth lower transistors 175 and 176, the fifth and sixth upper transistors 255 and 256, and the eleventh and twelfth upper transistors 275 and 276 may be electrically connected to the first and third lower transistors 151 and 153 and the ninth and eleventh lower transistors 171 and 173 through at least one of the corresponding fifth and sixth through electrodes 85 and 86 and the eleventh and twelfth through electrodes 95 and 96, and, at the same time, may be electrically connected to the first and third upper transistors 251 and 253 and the seventh and ninth upper transistors 271 and 273.

The first to fourth through electrodes 81, 82, 83 and 84 may be disposed relatively closer to the first cell area CAR1, and the seventh to tenth through electrodes 91, 92, 93 and 94 may be disposed relatively closer to the second cell area CAR2. The distances or gaps between each of the first to fourth through electrodes 81, 82, 83 and 84 and the first cell area CAR1 may be substantially the same as those between each of corresponding the seventh to tenth through electrodes 91, 92, 93 and 94 and the second cell area CAR2. For example, the distance between the first through electrode 81 and the first cell area CAR1 may be substantially the same as the distance between the seventh through electrode 91 and the second cell area CAR2.

The distance or gap between the plurality of channel structures 79 and the first to fourth through electrodes 81, 82, 83 and 84 in the first cell area CAR1 may be substantially the same as the distance between the corresponding plurality of channel structures 79 and the seventh to tenth through electrodes 91, 92, 93 and 94 in the second cell area CAR2. For example, the distance between a selected one of the plurality of channel structures 79 in the first cell area CAR1 and the first through electrode 81 may be substantially the same as the distance between the corresponding one of the plurality of channel structures 79 in the second cell area CAR2 and the seventh through electrode 91.

The signal transmission path of the first upper word line right portion 37W1R, the first upper word line left portion 37W1L, the second upper word line right portion 37W2R, the second upper word line left portion 37W2L, the first lower word line right portion 48W1R, the first lower word line left portion 48W1L, the second lower word line right portion 48W2R, and the second lower word line left portion 48W2L may be formed identically to each other. There may be reduced a wiring resistance deviation of the first upper word line right portion 37W1R, the first upper word line left portion 37W1L, the second upper word line right portion 37W2R, the second upper word line left portion 37W2L, the first lower word line right portion 48W1R, the first lower word line left portion 48W1L, the second lower word line right portion 48W2R, and the second lower word line left portion 48W2L.

The seventh and eighth lower transistors 157 and 158 and the fifteenth and sixteenth lower transistors 177 and 178 may be a page buffer circuit. Each of the seventh and eighth lower transistors 157 and 158 and the fifteenth and sixteenth lower transistors 177 and 178 may be connected to a corresponding one of the plurality of channel structures 79.

Referring to FIG. 10, a semiconductor device according to an embodiment of the present disclosure may include a shared slim structure. In an embodiment, the stacked structure ST may include a plurality of cell areas CAR1 and CAR2 and a connection area EXT. Each of the plurality of cell areas CAR1 and CAR2 may be disposed around the connection area EXT. The plurality of cell areas CAR1 and CAR2 may share the connection area EXT. For example, the connection area EXT may be disposed between the first cell area CAR1 and the second cell area CAR2. The connection area EXT may be referred to as a slim or slim area. Each of the first cell area CAR1 and the second cell area CAR2 may include a plurality of channel structures 79.

Referring to FIGS. 1 and 11, a second through electrode 82 may penetrate or pass through a connection pad RP, a plurality of first interlayer insulating layers 33, and a plurality of first horizontal line layers 37. A contact spacer 80S may surround a side surface of the second through electrode 82. The connection pad RP may be connected to a lower surface of a corresponding one of the plurality of first horizontal line layers 37. The connection pad RP may pass through the contact spacer 80S and directly contact a side surface of the second through electrode 82.

Referring to FIGS. 1 and 12, there may be provided a first undercut region UC1, which is formed by etching-back the contact spacer 80S between a second through electrode 82 and a first buried insulating layer 39 and between the second through electrode 82 and a corresponding one of a plurality of first horizontal line layers 37. A protruding portion RPP of the connection pad RP may be formed in the first undercut region UC1. The protruding portion RPP of the connection pad RP may directly contact a side surface of the second through electrode 82. The contact resistance between the connection pad RP and the second through electrode 82 may be reduced by the protruding portion RPP.

Referring to FIGS. 1 and 13, a plurality of second undercut regions UC2 may be provided between a plurality of first interlayer insulating layers 33. A plurality of lateral extension portions 80P of a contact spacer 80S may be formed in the plurality of second undercut regions UC2. There may be reduced the leakage current between a second through electrode 82 and a plurality of first horizontal line layers 37 due to the plurality of lateral extension portions 80P.

In embodiments of the disclosure, some or all of the configurations described with reference to FIGS. 11 to 13 may be similarly applied to other parts of the second through electrode 82, the first through electrode 81, and the third to sixth through electrodes 83, 84, 85 and 86.

Referring to FIGS. 1 and 14, a channel structure 79 may include a channel layer 71, an information storage layer 76, and a core layer 77. The information storage layer 76 may include a tunnel layer 72, a charge trap layer 73, a first blocking layer 74, and a second blocking layer 75. A memory cell MC may be provided in an intersection area between the channel structure 79 and a first horizontal line layer 37.

The channel layer 71 may surround the outside of the core layer 77. The information storage layer 76 may surround the outside of the channel layer 71. The channel layer 71 may be interposed between the information storage layer 76 and the core layer 77. The tunnel layer 72 may surround the outside of the channel layer 71. The tunnel layer 72 may contact the channel layer 71. The charge trap layer 73 may surround the outside of the tunnel layer 72. The first blocking layer 74 may surround the outside of the charge trap layer 73. The second blocking layer 75 may be disposed between the first blocking layer 74 and the first horizontal line layer 37. The second blocking layer 75 may extend on the upper and lower surfaces of the first horizontal line layer 37.

The channel structure 79 may include a drain plug (78 in FIG. 1). The drain plug (78 in FIG. 1) may contact the channel layer 71. The channel layer 71 may directly contact a common source line (61 in FIG. 1). In an embodiment, the second blocking layer 75 may be omitted.

Referring to FIGS. 1 and 15, a channel structure 79 may include a channel layer 71, an information storage layer 76 and a core layer 77. The information storage layer 76 may include a tunnel layer 72, a charge trap layer 73, and a first blocking layer 74. The first blocking layer 74 may be interposed between the charge trap layer 73 and a first horizontal line layer 37. Each of the tunnel layer 72, the charge trap layer 73 and the first blocking layer 74 is illustrated as having a similar thickness to each other, but in other embodiments may have different thicknesses. In an embodiment, the effective equivalent thickness of the first blocking layer 74 may be greater than the effective equivalent thickness of the tunnel layer 72.

FIGS. 16 to 27 are cross-sectional views illustrating methods of forming a semiconductor device according to embodiments of the present disclosure.

Figure 16:
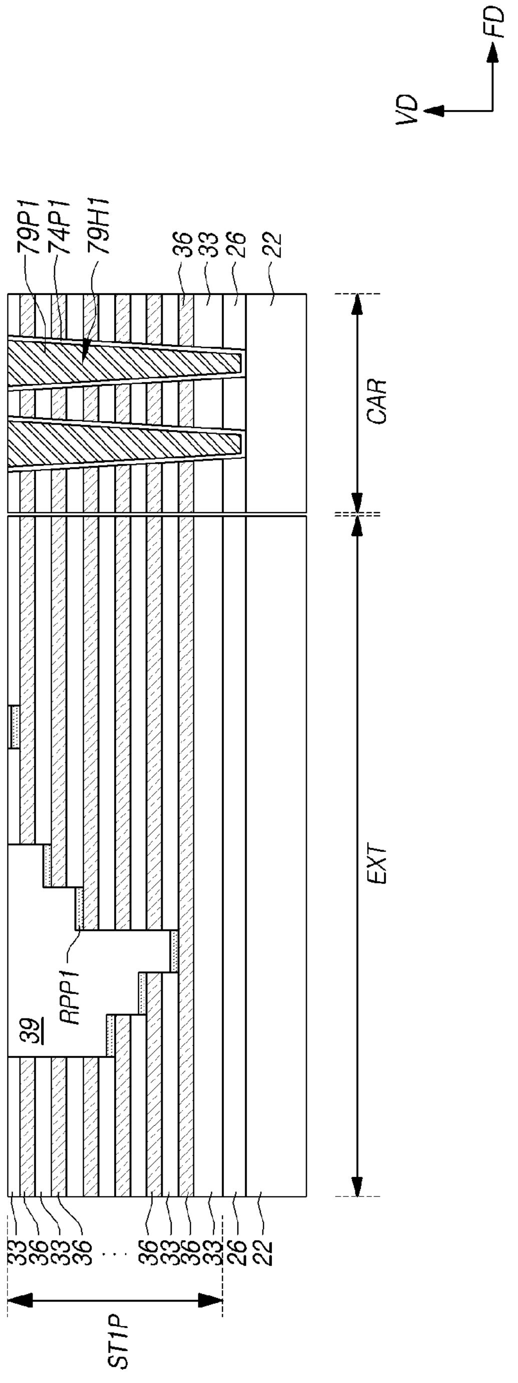
FIGS. 16 to 27 are cross-sectional views illustrating methods of forming a semiconductor device according to embodiments of the present disclosure.

Referring to FIG. 16, methods of forming a semiconductor device according to an embodiment of the present disclosure may include forming a sacrificial insulating layer 26 on a sacrificial substrate 22. A first preliminary stacked structure ST1P may be formed on the sacrificial insulating layer 26. The first preliminary stacked structure ST1P may include a plurality of first interlayer insulating layers 33, a plurality of first mold layers 36, and a first buried insulating layer 39.

The plurality of first interlayer insulating layers 33 and the plurality of first mold layers 36 may be alternately and repeatedly stacked. The plurality of first interlayer insulating layers 33 and the plurality of first mold layers 36 may be stacked in a second direction VD. In an embodiment, each of the lowermost and uppermost layers of the first preliminary stacked structure ST1P may include a corresponding one of a plurality of first interlayer insulating layers 33. Each of the plurality of first mold layers 36 may extend along a first direction FD. Each of the plurality of first mold layers 36 may extend from a cell area CAR to a connection area EXT. The plurality of first mold layers 36 may be formed to result in a stepped shape or structure within the connection area EXT. A plurality of first preliminary connection pads RPP1 may be formed in the connection area EXT.

Each of the plurality of first preliminary connection pads RPP1 may directly contact an upper surface of a corresponding one of the plurality of first mold layers 36. Some of the plurality of first preliminary connection pads RPP1 may be formed adjacent to an end of a corresponding one of the plurality of first mold layers 36. The first buried insulating layer 39 may cover the plurality of first preliminary connection pads RPP1 and the plurality of first mold layers 36. The first buried insulating layer 39 may contact the upper surfaces and side surfaces of the plurality of first preliminary connection pads RPP1, the side surfaces of the plurality of first mold layers 36, and the side surfaces of the plurality of first interlayer insulating layers 33. The side surfaces of the plurality of first mold layers 36 and the side surfaces of the plurality of first interlayer insulating layers 33 may be flat, and the side surfaces may be substantially planar and parallel to the second direction VD.

There may be formed a plurality of first preliminary channels 79P1 and a plurality of sacrificial spacers 74P1 extending through the first preliminary stacked structure ST1P and extending in the sacrificial insulating layer 26. The plurality of sacrificial spacers 74P1 may be formed to surround side surfaces and bottoms of the plurality of first preliminary channels 79P1. Each of the plurality of first preliminary channels 79P1 may extend in the second direction VD within the cell area CAR. Each of the plurality of first preliminary channels 79P1 may pass through the plurality of first interlayer insulating layers 33 and the plurality of first mold layers 36 and extend within the sacrificial insulating layer 26. Upper surfaces of the plurality of first preliminary channels 79P1, the plurality of sacrificial spacers 74P1, the first buried insulating layer 39, and the plurality of first interlayer insulating layers 33 may be exposed on substantially the same plane, which is common to an upper surface of the uppermost first interlayer insulating layer 33 in the first preliminary stacked structure ST1P.

The sacrificial substrate 22 may include a semiconductor substrate such as a silicon wafer. The sacrificial insulating layer 26 may include silicon oxide, silicon nitride, silicon oxynitride, or a combination thereof. The plurality of first interlayer insulating layers 33 may include at least two selected from the group consisting of Si, O, N, B, C, and H. The plurality of first interlayer insulating layers 33 may include silicon oxide, silicon nitride, silicon oxynitride, or a combination thereof. The plurality of first mold layers 36 may include a material having an etch selectivity with respect to the materials in the plurality of first interlayer insulating layers 33.

The plurality of first preliminary connection pads RPP1 may include a material having an etch selectivity with respect to the plurality of first mold layers 36 and the plurality of first interlayer insulating layers 33. In an embodiment, the plurality of first interlayer insulating layers 33 may include silicon oxide, the plurality of first mold layers 36 may include silicon nitride, and the plurality of first preliminary connection pads RPP1 may include polysilicon. The first buried insulating layer 39 may include silicon oxide, silicon nitride, silicon oxynitride, or a combination thereof. The first buried insulating layer 39 may include a material having an etch selectivity with respect to the plurality of first preliminary connection pads RPP1 and the plurality of first mold layers 36. In an embodiment, the first buried insulating layer 39 may include silicon oxide.

The plurality of first preliminary channels 79P1 may include a material having an etch selectivity with respect to the plurality of first mold layers 36 and the plurality of first interlayer insulating layers 33. In an embodiment, the plurality of first preliminary channels 79P1 may include polysilicon. The plurality of sacrificial spacers 74P1 may include a material having an etch selectivity with respect to the plurality of first preliminary channels 79P1. The plurality of sacrificial spacers 74P1 may include an insulating material such as silicon oxide, silicon nitride, silicon oxynitride, metal oxide, or a combination thereof. In an embodiment, the plurality of sacrificial spacers 74P1 may include silicon oxide.

Figure 17:
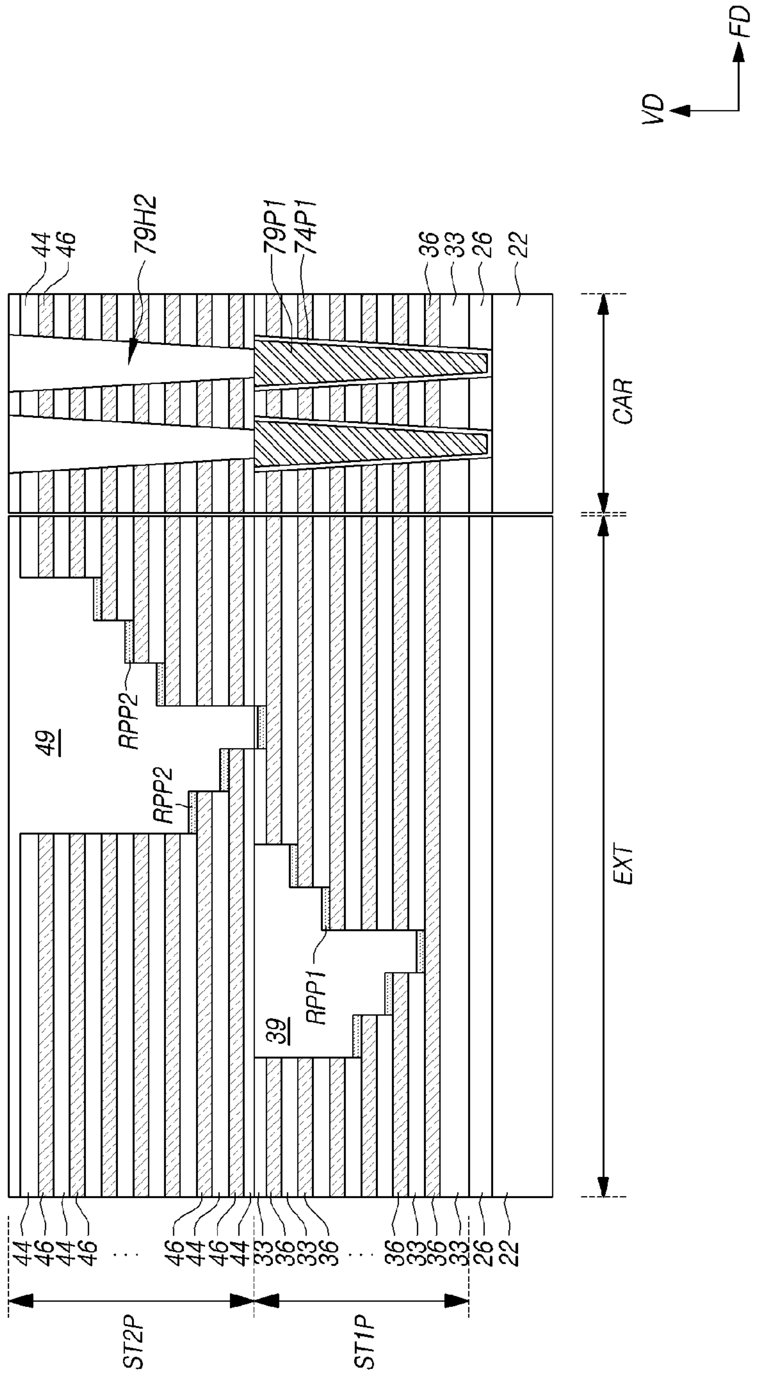

Referring to FIG. 17, a second preliminary stacked structure ST2P may be formed on the first preliminary stacked structure ST1P. The second preliminary stacked structure ST2P may include a plurality of second interlayer insulating layers 44, a plurality of second mold layers 46, and a second buried insulating layer 49.

The plurality of second interlayer insulating layers 44 and the plurality of second mold layers 46 may be alternately and repeatedly stacked. A plurality of second interlayer insulating layers 44 and a plurality of second mold layers 46 may be stacked in the second direction VD. In an embodiment, the lowermost layer of the second preliminary stacked structure ST2P may be one of the plurality of second interlayer insulating layers 44. The lower surface of the second preliminary stacked structure ST2P may directly contact the upper surface of the first preliminary stacked structure ST1P. An uppermost layer of the second preliminary stacked structure ST2P may include the second buried insulating layer 49. The second buried insulating layer 49 may cover an uppermost layer of the plurality of second interlayer insulating layers 44. Each of the plurality of second mold layers 46 may extend along the first direction FD. Each of the plurality of second mold layers 46 may extend from a cell area CAR to a connection area EXT. The plurality of second mold layers 46 may be arranged to result in a stepped shape or structure within the connection area EXT. A plurality of second preliminary connection pads RPP2 may be formed in the connection area EXT.

Each of the plurality of second preliminary connection pads RPP2 may directly contact an upper surface of a corresponding one of the plurality of second mold layers 46. Some of the plurality of second preliminary connection pads RPP2 may be formed adjacent to an end of a corresponding one of the plurality of second mold layers 46. The second buried insulating layer 49 may cover the plurality of second preliminary connection pads RPP2 and the plurality of second mold layers 46. The second buried insulating layer 49 may contact the upper surfaces and side surfaces of the plurality of second preliminary connection pads RPP2, the side surfaces of the plurality of second mold layers 46, and the side surfaces of the plurality of second interlayer insulating layers 44. The side surfaces of the plurality of second mold layers 46 and the side surfaces of the plurality of second interlayer insulating layers 44 may be flat, and the side surfaces may be substantially planar and parallel to the second direction VD.

A plurality of upper channel holes 79H2 penetrating the second preliminary stacked structure ST2P may be formed. Each of the plurality of upper channel holes 79H2 may extend in the second direction VD within the cell area CAR. Each of the plurality of upper channel holes 79H2 may pass through the plurality of second interlayer insulating layers 44 and the plurality of second mold layers 46. Each of the plurality of upper channel holes 79H2 may be aligned with an upper portion of a corresponding one of the plurality of first preliminary channels 79P1. The upper ends of the plurality of first preliminary channels 79P1 may be exposed to the bottoms of the plurality of upper channel holes 79H2.

The plurality of second interlayer insulating layers 44 may include the same material as the plurality of first interlayer insulating layers 33, the plurality of second mold layers 46 may include the same material as the plurality of first mold layers 36, and the plurality of second preliminary connection pads RPP2 may include the same material as the plurality of first preliminary connection pads RPP1. The second buried insulating layer 49 may include silicon oxide, silicon nitride, silicon oxynitride, or a combination thereof. The second buried insulating layer 49 may include a material having an etch selectivity with respect to the plurality of second preliminary connection pads RPP2 and the plurality of second mold layers 46. In an embodiment, the second buried insulating layer 49 may include silicon oxide.

Figure 18:
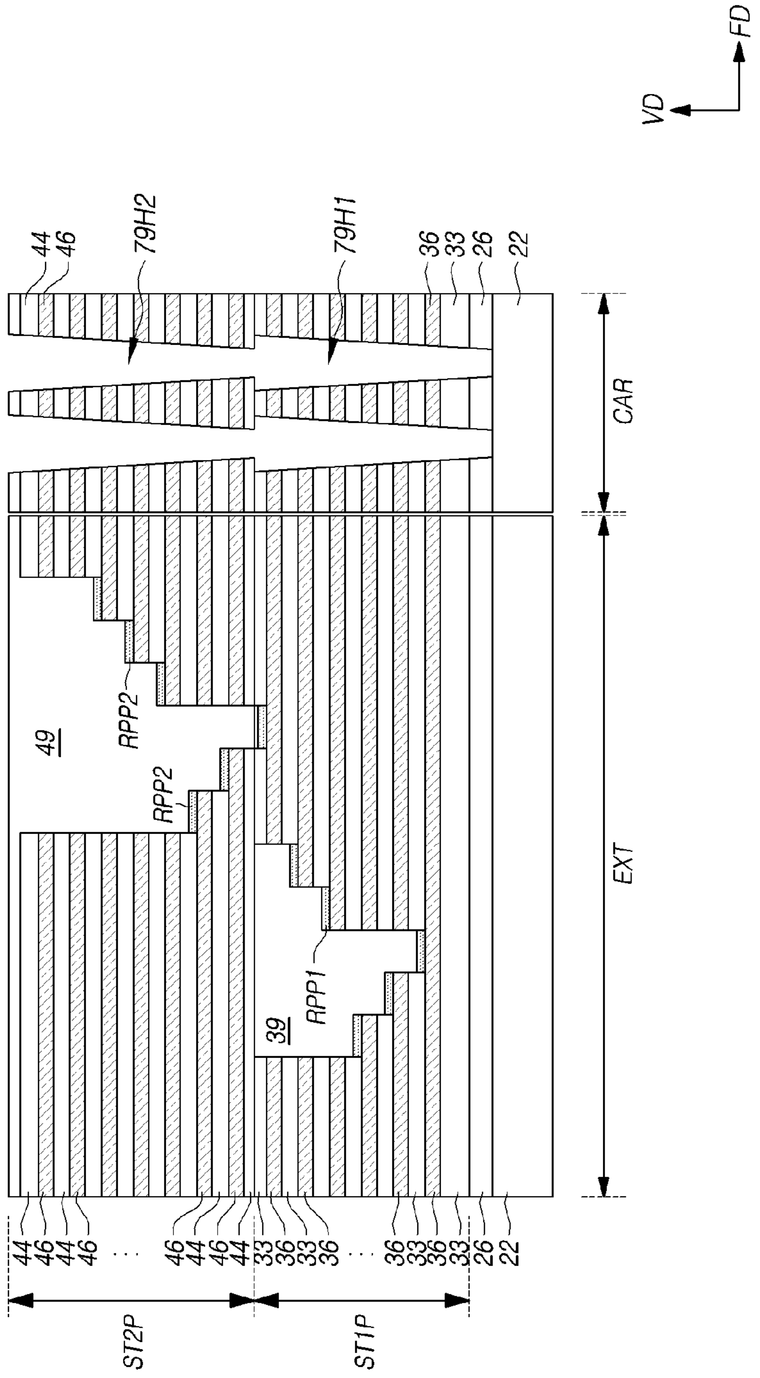

Referring to FIG. 18, a plurality of lower channel holes 79H1 may be exposed by removing a plurality of first preliminary channels 79P1 and a plurality of sacrificial spacers 74P1. Each of the plurality of lower channel holes 79H1 may communicate with a lower portion of a corresponding one of the plurality of upper channel holes 79H2. A plurality of first interlayer insulating layers 33, a plurality of first mold layers 36, a plurality of second interlayer insulating layers 44), and a plurality of second mold layers 46 may be exposed to the plurality of lower channel holes 79H1 and the plurality of upper channel holes 79H2.

Figure 19:
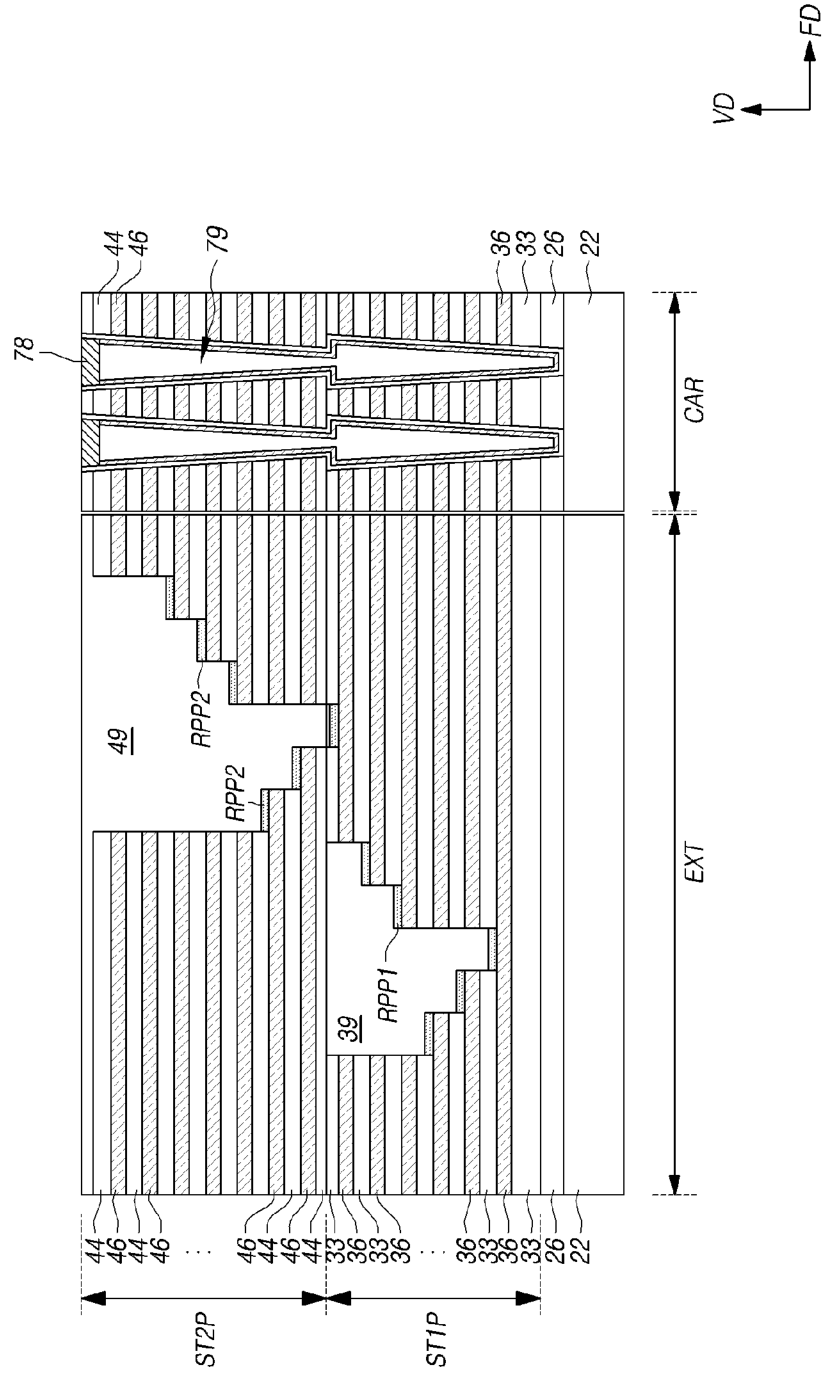

Referring to FIG. 19, a plurality of channel structures 79 may be formed in the plurality of upper channel holes 79H2 and the plurality of lower channel holes 79H1. In an embodiment, each of the plurality of channel structures 79 may include a channel layer 71, an information storage layer 76, and a core layer 77 similar to the layers illustrated in FIG. 15. The information storage layer 76 may include a tunnel layer 72, a charge trap layer 73 and a first blocking layer 74. Each of the plurality of channel structures 79 may include a drain plug 78. The drain plug 78 may contact the channel layer 71. Upper ends of the plurality of drain plugs 78 may be exposed and may be common to the upper surface of the second preliminary stacked structure ST2P.

In an embodiment, each of the plurality of channel structures 79 may extend within the sacrificial insulating layer 26 through the first preliminary stacked structure ST1P and the second preliminary stacked structure ST2P. The channel layer 71 may surround the outer side of the core layer 77. The tunnel layer 72 may surround the outside of the channel layer 71. The charge trap layer 73 may surround the outside of the tunnel layer 72. The first blocking layer 74 may surround the outside of the charge trap layer 73.

The channel layer 71 may include a semiconductor material such as polysilicon, amorphous silicon, monocrystalline silicon, or a combination thereof. The tunnel layer 72 may include silicon oxide. The charge trap layer 73 may include silicon nitride. The first blocking layer 74 may include silicon oxide, metal oxide, metal nitride, or a combination thereof. The core layer 77 may include silicon oxide, silicon nitride, silicon oxynitride, polysilicon, or a combination thereof.

Figure 20:
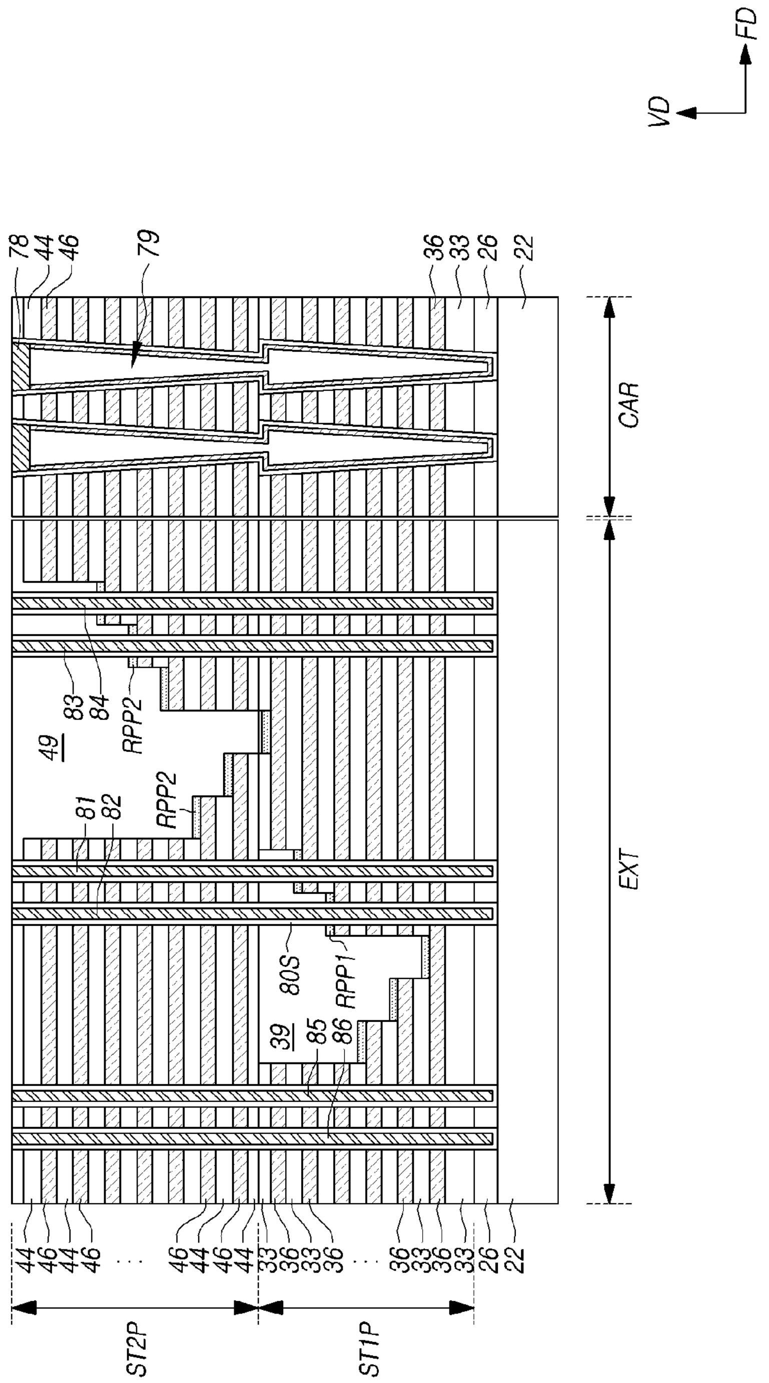

Referring to FIG. 20, a plurality of contact spacers 80S and a plurality of through electrodes 81, 82, 83, 84, 85, and 86 may be formed by extending through the second preliminary stacked structure ST2P and the first preliminary stacked structure ST1P to the sacrificial insulating layer 26 in the connection area EXT. Each of the plurality of contact spacers 80S may be formed to surround a side surface and a bottom of a corresponding one of the plurality of through electrodes 81, 82, 83, 84, 85 and 86. Each of the plurality of through electrodes 81, 82, 83, 84, 85 and 86 may extend in the second direction VD within the connection area EXT. Each of the plurality of through electrodes 81, 82, 83, 84, 85 and 86 may correspond to a high-aspect-ratio-contact (HARC) having an aspect ratio of 10:1 or more.

The first through electrode 81 and the second through electrode 82 may be adjacent to each other. Each of the first through electrode 81 and the second through electrode 82 may extend into the sacrificial insulating layer 26 by passing through a plurality of second interlayer insulating layers 44, a plurality of second mold layers 46, a first buried insulating layer 39, a first preliminary connection pad RPP1, a plurality of first mold layers 36 and a plurality of the first interlayer insulating layer 33.

The third through electrode 83 and the fourth through electrode 84 may be adjacent to each other. Each of the third through electrode 83 and the fourth through electrode 84 may pass through a second buried insulating layer 49, a second preliminary connection pad RPP2, a plurality of second mold layers 46, a plurality of second interlayer insulating layers 44, a plurality of first mold layers 36, and a plurality of second mold layers 46, and may extend into the sacrificial insulating layer 26. The fifth through electrode 85 and the sixth through electrode 86 may be adjacent to each other. The fifth through electrode 85 and the sixth through electrode 86 may pass through a plurality of second interlayer insulating layers 44, a plurality of second mold layers 46, a plurality of first mold layers 36, and the first interlayer insulating layer 33 and may extend into the sacrificial insulating layer 26.

The plurality of contact spacers 80S may include a material having an etch selectivity with respect to a plurality of first mold layers 36, a plurality of second mold layers 46, a plurality of first preliminary connection pads RPP1, and a plurality of second preliminary connection pads RPP2. The plurality of through electrodes 81, 82, 83, 84, 85 and 86 may include a conductive material such as metal, metal nitride, metal oxide, conductive carbon, polysilicon, or a combination thereof. Each of the plurality of through electrodes 81, 82, 83, 84, 85 and 86 may include a single layer or multiple layers. In an embodiment, the plurality of through electrodes 81, 82, 83, 84, 85 and 86 may include W, WN, Ru, Co, Pt, Ti, TiN, Ta, TaN, or a combination thereof. Each of the through electrodes 81, 82, 83, 84, 85 and 86 may include a conductive pattern and a barrier layer surrounding the outside of the conductive pattern.

Figure 21:
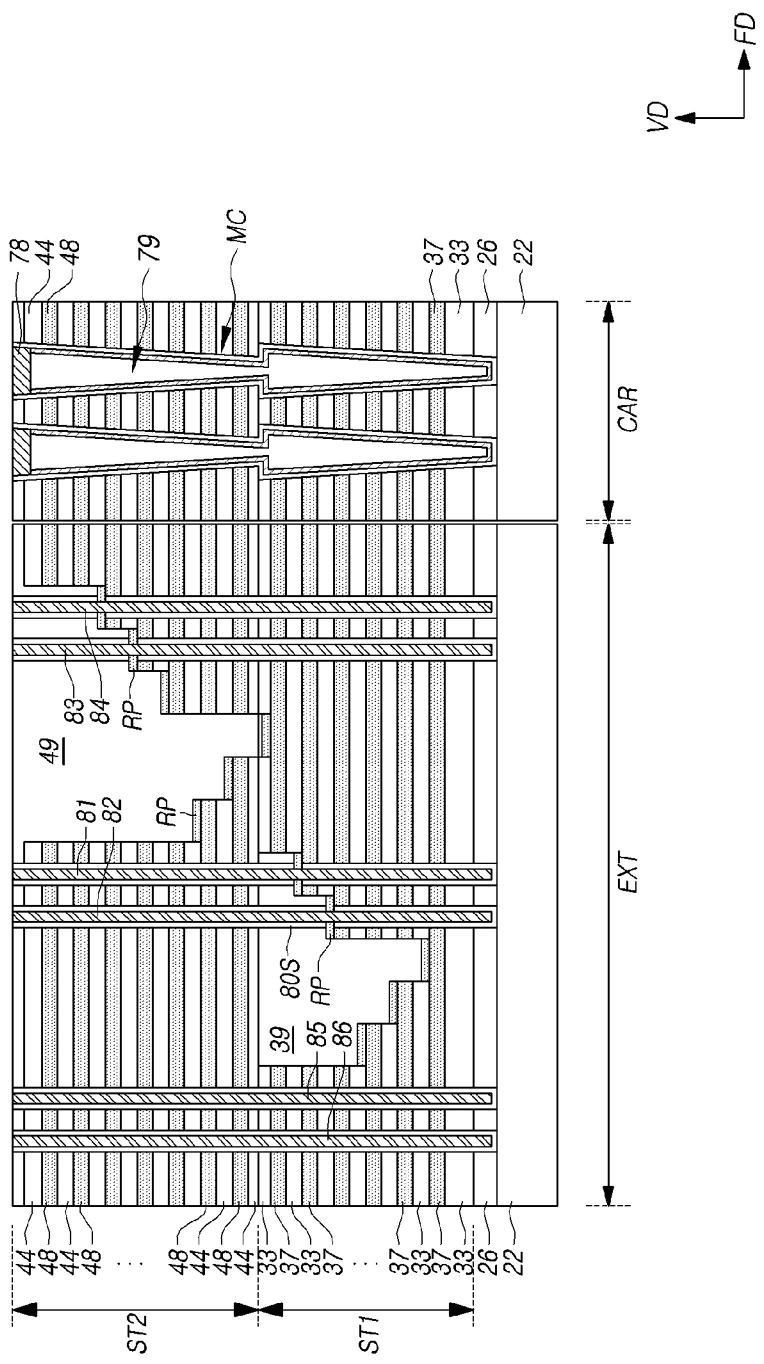

Referring to FIG. 21, a plurality of first mold layers 36, a plurality of second mold layers 46, a plurality of first preliminary connection pads RPP1, and a plurality of second preliminary connection pads RPP2 may be removed by selective etching, and a plurality of first horizontal line layers 37, a plurality of second horizontal line layers 48, and a plurality of connection pads RP may be formed. Some of the plurality of connection pads RP may pass through the contact spacer 80S and directly contact a corresponding side surface of the first to fourth through electrodes 81, 82, 83 and 84. The plurality of first interlayer insulating layers 33, the plurality of first horizontal line layers 37, the plurality of connection pads RP, and the first buried insulating layer 39 may form a first stacked structure ST1. The plurality of second interlayer insulating layers 44, the plurality of second horizontal line layers 48, the plurality of connection pads RP, and the second buried insulating layer 49 may form a second stacked structure ST2.

The plurality of first horizontal line layers 37, the plurality of second horizontal line layers 48, and the plurality of connection pads RP may include conductive materials such as metal, metal nitride, metal oxide, metal silicide, conductive carbon, polysilicon, or combinations thereof. Each of the plurality of first horizontal line layers 37, the plurality of second horizontal line layers 48, and the plurality of connection pads RP may include a single layer or multiple layers. In an embodiment, the plurality of first horizontal line layers 37, the plurality of second horizontal line layers 48, and the plurality of connection pads RP may include W, WN, Ru, Co, Pt, Ti, TiN, Ta, TaN, or a combination thereof. Each of the plurality of first horizontal line layers 37, the plurality of second horizontal line layers 48, and the plurality of connection pads RP may include a conductive pattern and a barrier layer surrounding the outside of the conductive pattern.

Figure 22:
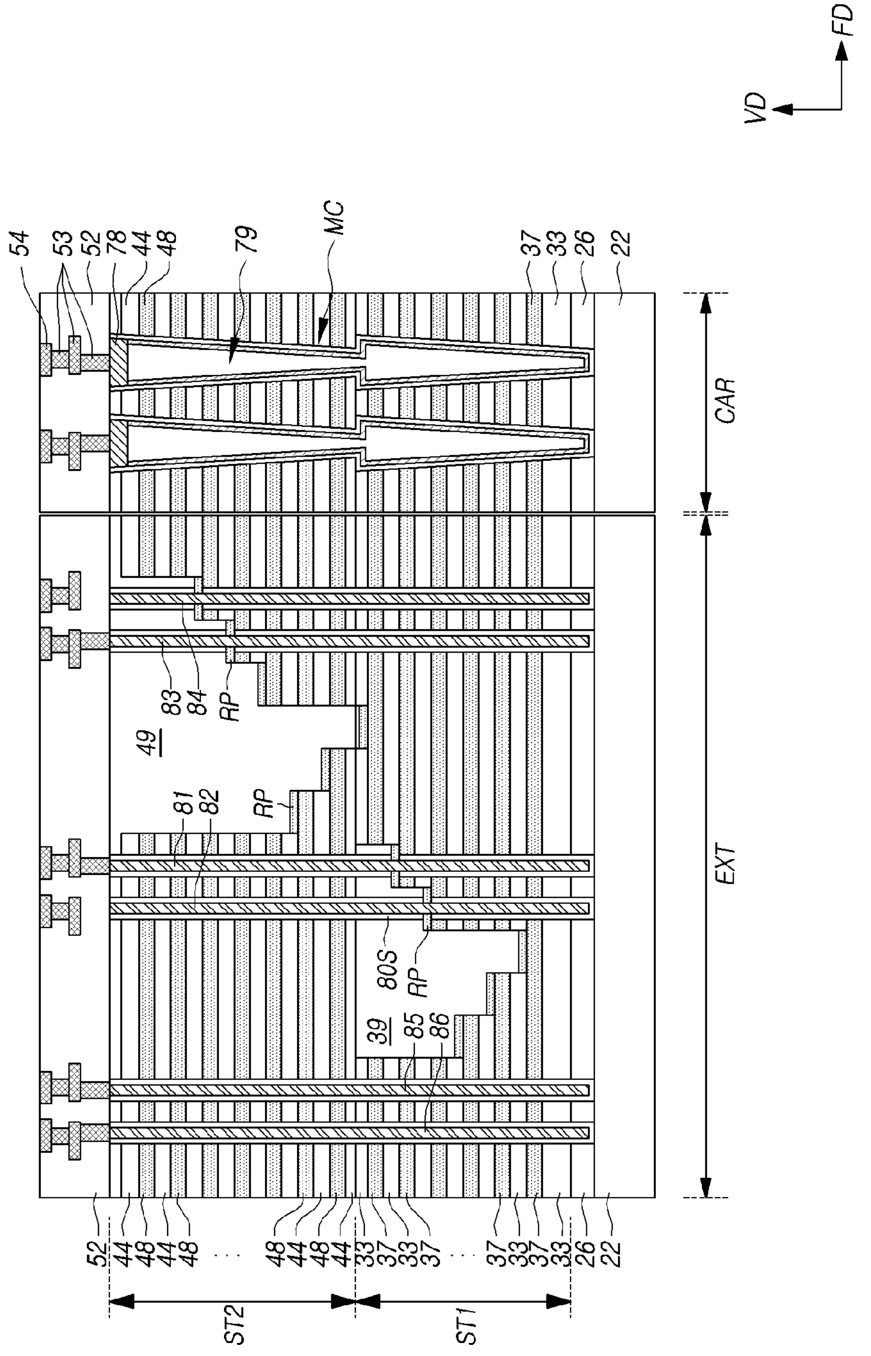

Referring to FIG. 22, a first insulating layer 52 may be formed on the second stacked structure ST2. A plurality of first intermediate lines 53 and a plurality of lower bonding pads 54 may be formed in the first insulating layer 52. Forming the first insulating layer 52 and the plurality of lower bonding pads 54 may be formed using a plurality of thin film forming processes and planarization processes. In an embodiment, the planarization process for forming the first insulating layer 52 and the plurality of lower bonding pads 54 may include a chemical mechanical polishing (CMP) process, an etch-back process, or a combination thereof. Top surfaces or upper surfaces of the first insulating layer 52 and the plurality of lower bonding pads 54 may be exposed on substantially the same plane. An uppermost surface of the first insulating layer 52 may include silicon oxide. An uppermost surface of the plurality of lower bonding pads 54 may include Cu.

Figure 23:
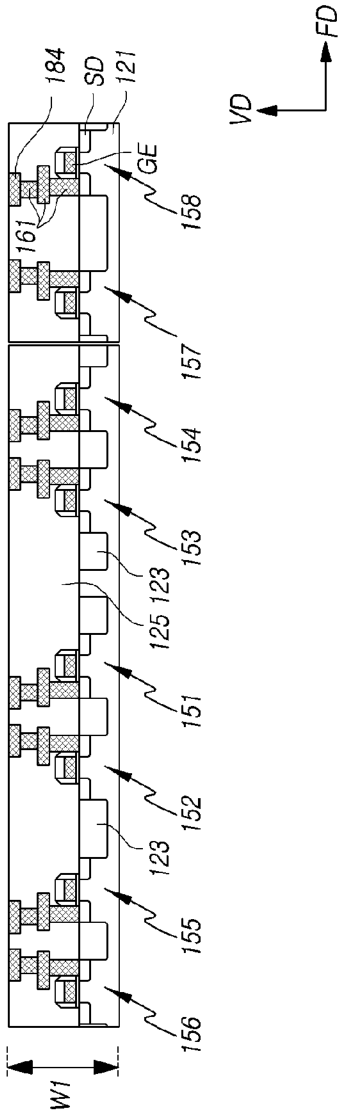

Referring to FIG. 23, a lower device isolation layer 123, a lower insulating layer 125, a plurality of lower transistors 151, 152, 153, 154, 155, 156, 157 and 158, a plurality of lower lines 161, and a plurality of first bonding pads 184 may be formed on a first substrate 121. Forming the lower insulating layer 125 and the plurality of first bonding pads 184 may include use of a plurality of thin film formation processes and planarization processes. In an embodiment, the planarization process for forming the lower insulating layer 125 and the plurality of first bonding pads 184 may include a chemical mechanical polishing (CMP) process, an etch-back process, or a combination thereof. Top surfaces or upper surfaces of the lower insulating layer 125 and the plurality of first bonding pads 184 may be exposed on substantially the same plane.

Each of the plurality of lower transistors 151, 152, 153, 154, 155, 156, 157 and 158 may include a gate electrode GE and a pair of source/drain areas SD. The lower insulating layer 125 may cover the lower device isolation layer 123, a plurality of lower transistors 151, 152, 153, 154, 155, 156, 157 and 158, a plurality of lower lines 161, and a plurality of first bonding pads 184. The plurality of lower lines 161 may include a plurality of horizontal lines and a plurality of vertical lines. Each of the plurality of lower lines 161 may be electrically connected to a corresponding one of the plurality of lower transistors 151, 152, 153, 154, 155, 156, 157 and 158 and a corresponding one of a pair of source/drain areas SD. Each of the plurality of first bonding pads 184 may contact a corresponding one of the plurality of lower lines 161. In an embodiment, the uppermost surface of the lower insulating layer 125 may include silicon oxide. Top surfaces of the plurality of first bonding pads 184 may include Cu.

Figure 24:
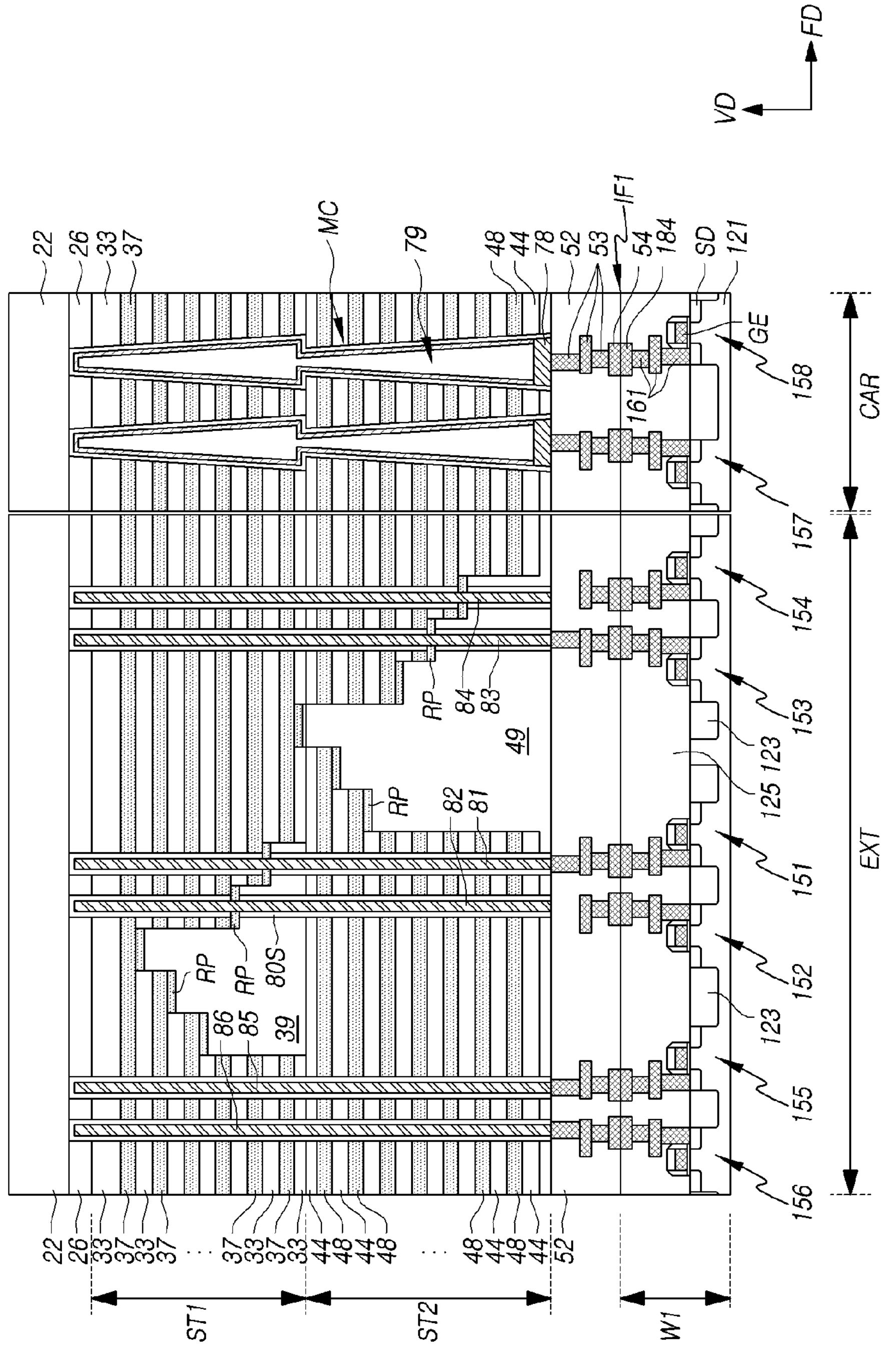
Figure 25:
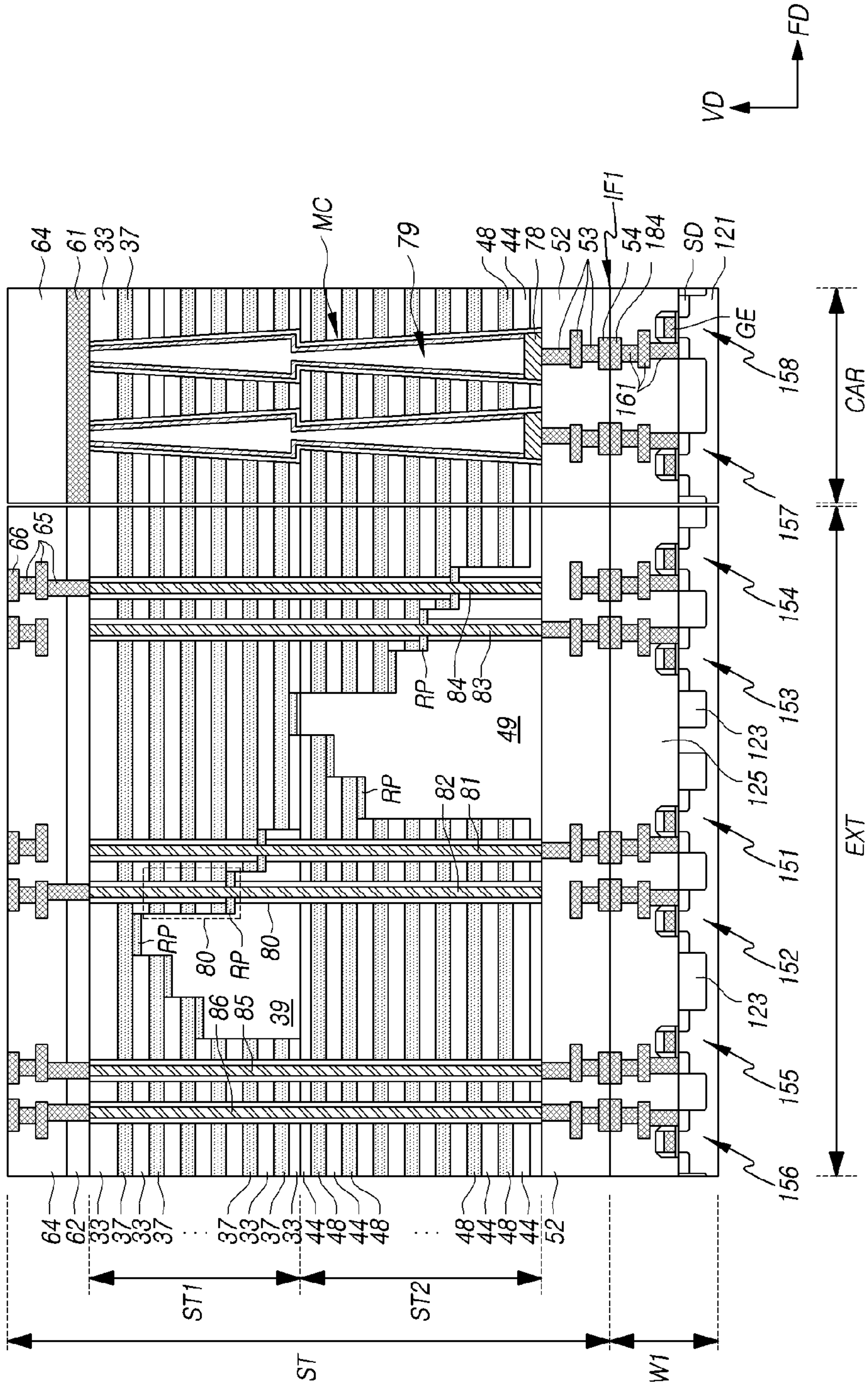

Referring to FIG. 24, a sacrificial substrate 22 may be bonded on a first substrate 121. A first interface IF1 may be formed between the lower insulating layer 125 and the first insulating layer 52 and between the plurality of first bonding pads 184 and the plurality of lower bonding pads 54. The first insulating layer 52 may directly contact the lower insulating layer 125, and the plurality of lower bonding pads 54 may directly contact the plurality of first bonding pads 184. Referring to FIG. 25, the ends of a plurality of through electrodes 81, 82, 83, 84, 85 and 86, and a plurality of channel structures 79 may be exposed on one side of the first stacked structure ST1 by removing the sacrificial substrate 22 and the sacrificial insulating layer 26. Removing the sacrificial substrate 22 and the sacrificial insulating layer 26 may include a planarization process such as a chemical mechanical polishing (CMP) process, an etch-back process, or a combination thereof. Top surfaces of the plurality of first interlayer insulating layers 33, the plurality of contact spacers 80S, the plurality of through electrodes 81, 82, 83, 84, 85 and 86, and the plurality of channel structures 79 may form substantially the same plane.

A common source line 61 and a source insulating layer 62 may be formed on the first stacked structure ST1. The common source line 61 may cover the plurality of first interlayer insulating layers 33 and the plurality of channel structures 79 in the cell area CAR. The common source line 61 may directly contact a channel layer (71 in FIG. 15). The common source line 61 may include a single layer or multiple layers. The common source line 61 may include a conductive material such as polysilicon, metal, metal nitride, metal oxide, conductive carbon, or a combination thereof. In an embodiment, the common source line 61 may include polysilicon. The lower surface of the common source line 61 may form substantially the same plane as uppermost ends of the plurality of contact spacers 80S and the plurality of through electrodes 81, 82, 83, 84, 85 and 86. The source insulating layer 62 may cover the plurality of first interlayer insulating layers 33, the plurality of contact spacers 80S, and the plurality of through electrodes 81, 82, 83, 84, 85 and 86.

A second insulating layer 64, a plurality of second intermediate lines 65, and a plurality of upper bonding pads 66 may be formed on the common source line 61 and the source insulating layer 62. The second insulating layer 64 may cover the plurality of second intermediate lines 65 and the plurality of upper bonding pads 66. Some of the plurality of second intermediate lines 65 may pass through the source insulating layer 62 and contact the plurality of through electrodes 81, 82, 83, 84, 85 and 86. The plurality of second intermediate lines 65 may include a plurality of horizontal lines and a plurality of vertical lines. Each of the plurality of upper bonding pads 66 may contact a corresponding one of the plurality of second intermediate lines 65.

A plurality of thin film formation processes and planarization processes may be used to form the plurality of upper bonding pads 66 and the second insulating layer 64. A planarization process for forming the plurality of upper bonding pads 66 and the second insulating layer 64 may include a chemical mechanical polishing (CMP) process, an etch-back process, or a combination thereof. Top surfaces of the plurality of upper bonding pads 66 and the second insulating layer 64 may be exposed on substantially the same plane. In an embodiment, an uppermost surface of the plurality of upper bonding pads 66 may include Cu. An uppermost surface of the second insulating layer 64 may include silicon oxide.

Figure 26:
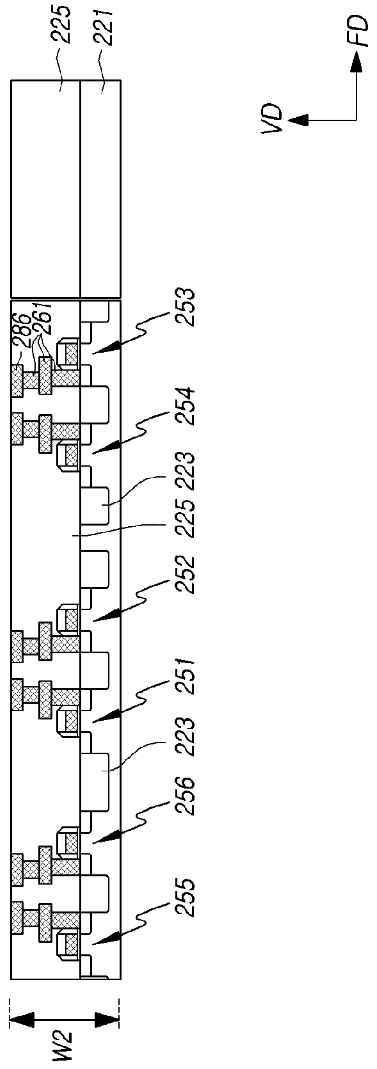

Referring to FIG. 26, an upper device isolation layer 223, an upper insulating layer 225, a plurality of upper transistors 251, 252, 253, 254, 255 and 256, a plurality of upper lines 261, and a plurality of second bonding pads 286 may be formed on a second substrate 221. Forming the upper insulating layer 225 and the plurality of second bonding pads 286 may include using a plurality of thin film forming processes and planarization processes. In an embodiment, the planarization process for forming the upper insulating layer 225 and the plurality of second bonding pads 286 may include a chemical mechanical polishing (CMP) process, an etch-back process, or a combination thereof. The upper surfaces of the upper insulating layer 225 and the plurality of second bonding pads 286 may be exposed on substantially the same plane.

Each of the plurality of upper transistors 251, 252, 253, 254, 255 and 256 may include a gate electrode (GE in FIG. 25) and a pair of source/drain areas (SD in FIG. 25). The upper insulating layer 225 may cover the upper device isolation layer 223, the plurality of upper transistors 251, 252, 253, 254, 255 and 256, the plurality of upper lines 261, and the plurality of second bonding pads 286. The plurality of upper lines 261 may include a plurality of horizontal lines and a plurality of vertical lines. Each of the plurality of upper lines 261 may be electrically connected to a corresponding one of a pair of source/drain areas (SD in FIG. 25) of a corresponding one of the plurality of upper transistors 251, 252, 253, 254, 255 and 256. Each of the plurality of second bonding pads 286 may contact a corresponding one of the plurality of upper lines 261. In an embodiment, an uppermost surface of the upper insulating layer 225 may include silicon oxide. The uppermost surfaces of the plurality of second bonding pads 286 may include Cu.

Figure 27:
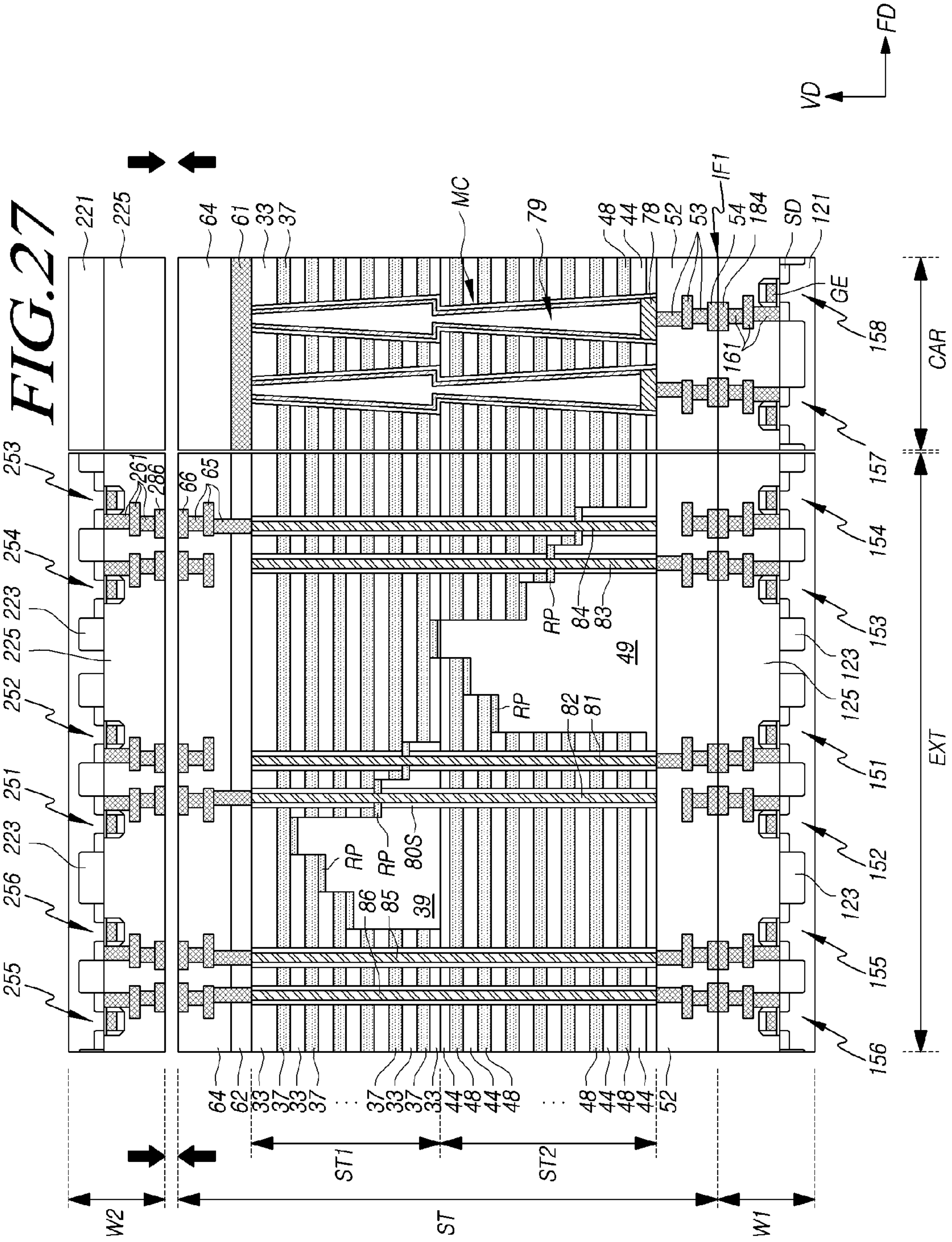

Referring to FIGS. 1 and 27, an upper insulating layer 225 may be bonded on a second insulating layer 64 and the plurality of upper bonding pads 66. A second interface IF2 may be formed between the second insulating layer 64 and the upper insulating layer 225 and between the plurality of upper bonding pads 66 and the plurality of second bonding pads 286. The upper insulating layer 225 may directly contact the second insulating layer 64, and the plurality of second bonding pads 286 may directly contact the plurality of upper bonding pads 66.

Each of the first substrate 121 and the second substrate 221 may include a semiconductor substrate such as a silicon wafer, a silicon-on-insulator (SOI) wafer, a Ge wafer, a GaAs wafer, a GaP wafer, a GaAsP wafer, or a combination thereof. The lower device isolation layer 123 and the upper device isolation layer 223 may be formed using trench isolation technology. The lower device isolation layer 123, the lower insulating layer 125, the first insulating layer 52, the source insulating layer 62, the second insulating layer 64, the upper device isolation layer 223, and the upper insulating layer 225 may include a single layer or multiple layers. The lower device isolation layer 123, the lower insulating layer 125, the first insulating layer 52, the source insulating layer 62, the second insulating layer 64, the upper device isolation layer 223, and the upper insulating layer 225 may include silicon oxide, silicon nitride, silicon oxynitride, low-K dielectrics, high-K dielectrics, or a combination thereof.

The gate electrode GE, the plurality of lower lines 161, a plurality of first bonding pads 184, a plurality of first intermediate lines 53, a plurality of lower bonding pads 54, the plurality of second intermediate lines 65, the plurality of upper bonding pads 66, the plurality of upper lines 261, and the plurality of second bonding pads 286 may include a conductive material such as metal, metal nitride, metal oxide, conductive carbon, or polysilicon, or a combination thereof. In an embodiment, the gate electrode GE, the plurality of lower lines 161, the plurality of first bonding pads 184, the plurality of first intermediate lines 53, the plurality of lower bonding pads 54, the plurality of second intermediate lines 65, the plurality of upper bonding pads 66, the plurality of upper lines 261, and the plurality of second bonding pads 286 may include W, WN, Cu, Sn, Ag, Au, Ru, Co, Pt, Ti, TiN, Ta, TaN, or combinations thereof.

Figure 28:
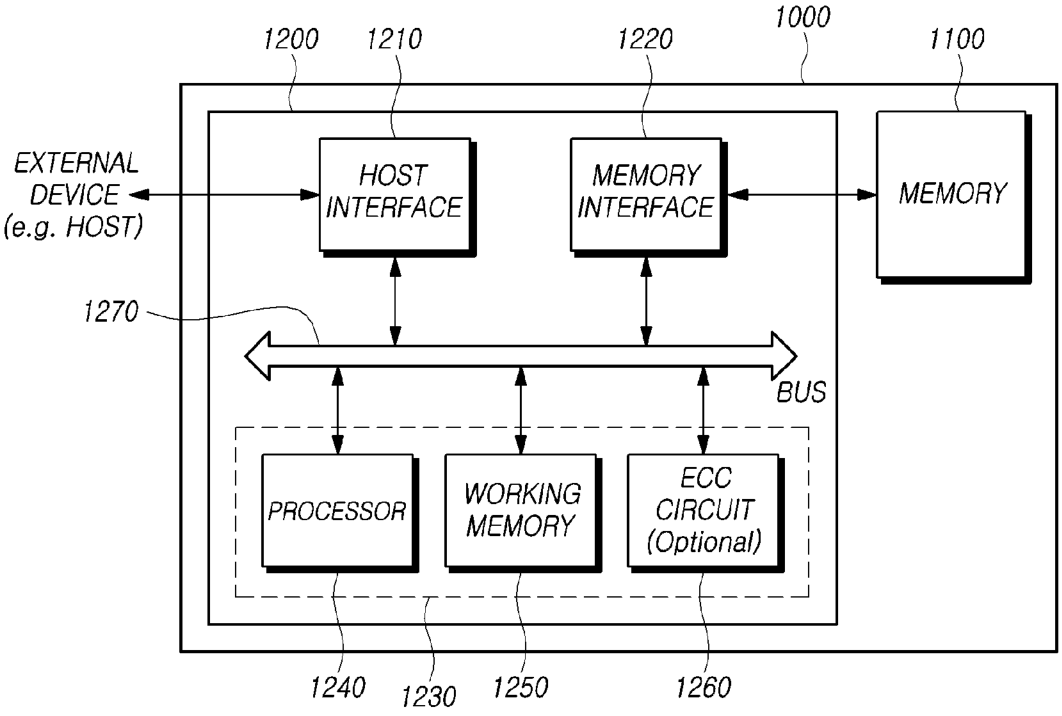
FIG. 28 illustrates a schematic diagram of a storage device according to embodiments of the present disclosure.
Figure 29:
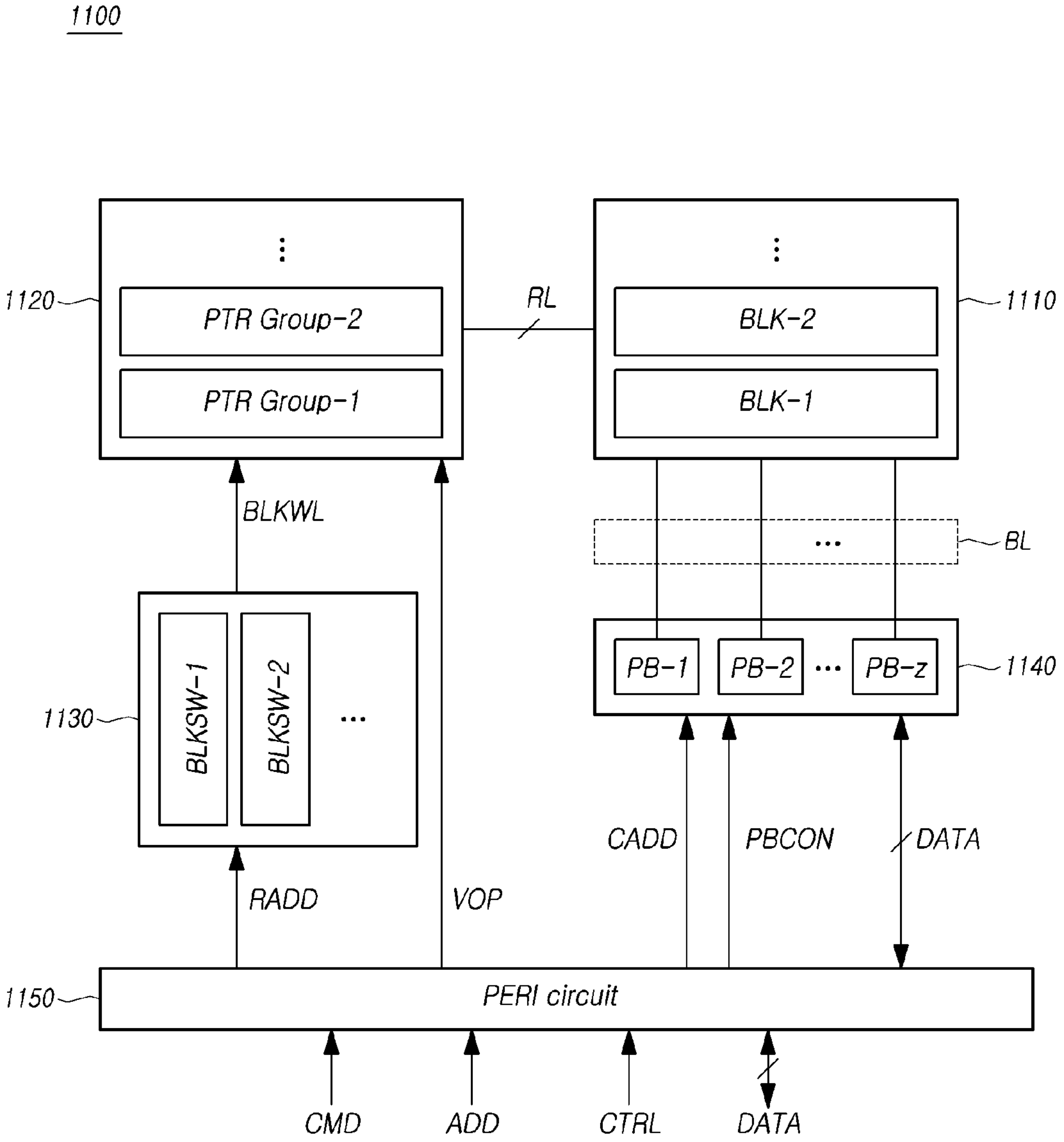
FIG. 29 is a schematic block diagram of a memory of FIG. 28.

FIG. 28 is a schematic diagram of a storage device according to embodiments of the present disclosure, and FIG. 29 is a schematic block diagram of a memory of FIG. 28.

Referring to FIG. 28, a storage device 1000 according to embodiments of the present disclosure may include a memory 1100 for storing data and a controller 1200 for controlling the memory 1100. The memory 1100 may include a plurality of memory blocks and may operate in response to control of the controller 1200. In an embodiment, the operation of the memory 1100 may include a read operation, a program operation (also referred to as "write operation"), and an erase operation. The memory 1100 may include a memory cell array having a plurality of memory cells storing data. The memory cell array may be located within a memory block.

The memory 1100 may include non-volatile memory, pseudo non-volatile memory, volatile memory, or a combination thereof. In an embodiment, the memory 1100 may include NAND flash memory, NOR flash memory, resistive random access memory (RRAM), phase-change random access memory (PRAM), and magnetoresistive random access memory (MRAM), spin transfer torque (STT) MRAM, spin-orbit torque (SOT) MRAM, ferroelectric random access memory (FRAM), 3D X-point memory, dynamic random access memory (DRAM), graphics double data rate (GDDR), synchronous DRAM (SDRAM), Rambus DRAM (RDRAM), high bandwidth memory (HBM), static random access memory (SRAM), or a combination thereof.

The memory 1100 may receive a command and an address from the controller 1200 and access a region selected by the address in the memory cell array. In an embodiment, the memory 1100 may perform an operation indicated by a command for an area selected by an address. The memory 1100 may perform a program operation, a read operation, an erase operation, and the like.

The controller 1200 may control write (program), read, erase, and background operations of the memory 1100. The background operations may include an operation of garbage collection (GC), wear leveling (WL), read reclaim (RR), bad block management (BBM), or a combination thereof. The controller 1200 may control the operation of the memory 1100 according to a request from a device (e.g., a host) located outside the storage device 1000. In an embodiment, the controller 1200 may control the operation of the memory 1100 regardless of a request from the host HOST.

The host may include a computer, smart phone, navigation, black box, digital camera, smart television, digital video recorder storage constituting a data center, one of electronic devices constituting a home network, one of various electronic devices constituting a computer network, one of various electronic devices constituting a telematics network, a radio frequency identification (RFID) device, various mobile devices (e.g., vehicles, robots, drones), or a combination thereof.

In an embodiment, the controller 1200 may include a host interface 1210, a memory interface 1220, a control circuit 1230, or a combination thereof. The host interface 1210 may provide an interface for communication with the host. When receiving a command from the host, the control circuit 1230 may receive the command through the host interface 1210 and process the received command. The memory interface 1220 may be connected to the memory 1100 to provide an interface for communication with the memory 1100. The memory interface 1220 may be configured to provide an interface between the memory 1100 and the controller 1200 in response to control of the control circuit 1230.

The control circuit 1230 may control the operation of the memory 1100 by performing overall control operations of the controller 1200. In an embodiment, the control circuit 1230 may include a processor 1240, a working memory 1250, an error detection and correction circuit (ECC Circuit) 1260, or a combination thereof. The processor 1240 may control operations of the controller 1200 and perform logical operations. The processor 1240 may communicate with the host through the host interface 1210 and may communicate with the memory 1100 through the memory interface 1220.

The processor 1240 may perform a function of a flash translation layer (FTL). The processor 1240 may randomize data received from the host. The processor 1240 may control the operation of the controller 1200 by executing firmware. In an embodiment, the firmware may be loaded into the working memory 1250 from the memory 1100 or a separate non-volatile memory (e.g., ROM, NOR Flash) located outside the memory 1100. When executing a booting operation after power-on, the processor 1240 may first load all or part of the firmware into the working memory 1250. The processor 1240 may perform logic operations defined in firmware loaded into the working memory 1250 to control the overall operation of the controller 1200. In an embodiment, the processor 1240 may load metadata required to drive firmware from the memory 1100. In an embodiment, the firmware may be updated while the storage device 1000 is being manufactured or while the storage device 1000 is being used. The controller 1200 may download new firmware from outside of the storage device 1000 and update the existing firmware to the new firmware.

The working memory 1250 may store firmware, program codes, commands, or data required to drive the controller 1200. The working memory 1250 may include volatile memory such as static RAM (SRAM), dynamic RAM (DRAM), synchronous DRAM (SDRAM), or a combination thereof.

The error detection and correction circuit 1260 may detect an error bit of target data using an error correction code and correct the detected error bit. The target data may include data stored in the working memory 1250, data read from the memory 1100, or a combination thereof.

A bus 1270 may be configured to provide a channel between components 1210, 1220, 1240, 1250 and 1260 of the controller 1200. The bus 1270 may include a control bus for transferring various control signals, commands, and the like, and a data bus for transferring various data.

In an embodiment, some of the components 1210, 1220, 1240, 1250 and 1260 of the controller 1200 may be deleted, or some of the components 1210, 1220, 1240, 1250 and 1260 may be integrated into one component. One or more other components may be added to the controller 1200 in addition to the components described above.

Referring to FIG. 29, a memory 1100 according to an embodiment of the present disclosure may include a memory cell array 1110, a pass transistor circuit 1120, a block selection circuit 1130, a page buffer circuit 1140, and a peripheral (PERI) circuit 1150. The memory cell array 1110 may be connected to the pass transistor circuit 1120 through a plurality of row lines RL, and connected to the page buffer circuit 1140 through a plurality of bit lines BL. The plurality of row lines RL may include a plurality of word lines and a plurality of select lines. The plurality of select lines may include at least one source select line and at least one drain select line. In an embodiment, the plurality of row lines RL may include at least one gate-induced-drain-leakage (GIDL) control line.

The memory cell array 1110 may include a plurality of memory blocks BLK-1 and BLK-2. In an embodiment, each of the plurality of memory blocks BLK-1 and BLK-2 may be a basic unit of an erase operation.

The pass transistor circuit 1120 may, in response to a block selection signal BLKWL from the block selection circuit 1130, transfer an operating voltage VOP from the peripheral circuit 1150 to a plurality of row lines RL of a memory block selected from among a plurality of memory blocks BLK-1 and BLK-2 of the memory cell array 1110. The pass transistor circuit 1120 may include a plurality of pass transistor groups PTR Group-1 and PTR Group-2 corresponding to the plurality of memory blocks BLK-1 and BLK-2.

The pass transistor circuit 1120 may ground a plurality of selection lines of a memory block selected from among the plurality of memory blocks BLK-1 and BLK-2 in response to the discharge enable signal.

The block selection circuit 1130 may generate a block selection signal BLKWL in response to a row address signal RADD from the peripheral circuit 1150, and provide the generated block selection signal BLKWL to the pass transistor circuit 1120. The pass transistor circuit 1120 and the block selection circuit 1130 may constitute a row decoder. A row decoder may be referred to as an X decoder or an address decoder. The block selection circuit 1130 may include a plurality of block switches BLKSW-1 and BLKSW-2.

The page buffer circuit 1140 may be connected to the memory cell array 1110 through a plurality of bit lines BL. The page buffer circuit 1140 may receive a page buffer control signal PBCON from the peripheral circuit 1150 and transmit/receive the data signal DATA to and from the peripheral circuit 1150.

The page buffer circuit 1140 may control the plurality of bit lines BL connected to the memory cell array 1110 in response to the page buffer control signal PBCON. For example, the page buffer circuit 1140 may detect signals of a plurality of bit lines BL of the memory cell array 1110 in response to the page buffer control signal PBCON, thereby detecting data stored in the memory cells of the memory cell array 1110 and transmitting a data signal DATA to the peripheral circuit 1150 according to the detected data. The page buffer circuit 1140 may apply signals to the plurality of bit lines BL based on the data signal DATA received from the peripheral circuit 1150 in response to the page buffer control signal PBCON, and may write the data to the memory cells of the memory cell array 1110. The page buffer circuit 1140 may write data to or read data from a memory cell connected to a word line activated by a row decoder. The page buffer circuit 1140 may include a plurality of page buffers PB-1, PB-2, and PB-z.

The peripheral circuit 1150 may receive a command signal CMD, an address signal ADD, and a control signal CTRL from an external device of the memory 1100, for example, a memory controller, and may transmit and receive data DATA with an external device of the memory 1100.

The peripheral circuit 1150 may output signals for writing data to or reading data from the memory cell array 1110, such as a row address signal RADD, a column address signal CADD, and a page buffer control signal PBCON based on the command signal CMD, address signal ADD, and control signal CTRL. Using the row address signal RADD, the column address signal CADD, and the page buffer control signal PBCON, the page buffer circuit 1140 writes data into the memory cell array 1110 or reads data from the memory cell array 1110, based on the command signal CMD, the address signal ADD, and the control signal CTRL received by the peripheral circuit 1150. The peripheral circuit 1150 may generate various voltages required by the memory 1100 including the operating voltage VOP. For example, the peripheral circuit 1150 may generate various levels of program voltages, pass voltages, read voltages, and erase voltages.

In an embodiment, the memory cell array 1110 may include a first memory block BLK-1. The pass transistor circuit 1120 may include first and second pass transistor groups PTR Group-1 and PTR Group-2 corresponding to the first memory block BLK-1. The block selection circuit 1130 may include a first block switch BLKSW-1.

In an embodiment, the first pass transistor group PTR Group-1 and the second pass transistor group PTR Group-2 may be connected to the first memory block BLK-1 via a plurality of row lines RL. In response to the block selection signal BLKWL from the block selection circuit 1130, the first pass transistor group PTR Group-1 and the second pass transistor group PTR Group-2 may be selected. The first pass transistor group PTR Group-1 and the second pass transistor group PTR Group-2 may transfer an operating voltage VOP from the peripheral circuit 1150 to a plurality of row lines RL of the first memory block BLK-1.

Referring again to FIGS. 1 and 29, in an embodiment, the first memory block BLK-1 may include a plurality of first horizontal line layers 37, a plurality of second horizontal line layers 48, and a plurality of channel structures 79. A plurality of memory cells MC may be disposed at intersections of the plurality of channel structures 79 and the plurality of first horizontal line layers 37 and intersections of the plurality of channel structures 79 and the plurality of second horizontal line layers 48.

The plurality of first horizontal line layers 37 and the plurality of second horizontal line layers 48 may include a plurality of word lines, at least one source select line, and at least one drain select line. The plurality of first horizontal line layers 37 and the plurality of second horizontal line layers 48 may further include at least one GIDL control line and several dummy lines. At least one of the plurality of first horizontal line layers 37 adjacent to a common source line 61 may correspond to a source select line. At least one of the plurality of second horizontal line layers 48 adjacent to a first interface IF1 may correspond to a drain select line.

The pass transistor circuit 1120 may be distributed and disposed in the first logic structure W1 and the second logic structure W2. In an embodiment, the first pass transistor group PTR Group-1 may be disposed in the first logic structure W1, and the second pass transistor group PTR Group-2 may be disposed in the second logic structure W2. The first pass transistor group PTR Group-1 may include first to fourth lower transistors 151, 152, 153 and 154, and the second pass transistor group PTR Group-2 may include first to fourth upper transistors 251, 252, 253, and 254. In the first logic structure W1 and the second logic structure W2, the line density of the pass transistor circuit 1120 may be reduced.

At least one of the first logic structure W1 and the second logic structure W2 may include a block selection circuit 1130. In an embodiment, the block selection circuit 1130 may be distributed and disposed in the first logic structure W1 and the second logic structure W2. The first block switch BLKSW-1 may include at least one block selection transistor. At least one of the fifth and sixth lower transistors 155 and 156 and the fifth and sixth upper transistors 255 and 256 may correspond to a block selection transistor in the first block switch BLKSW-1. For example, each of the fifth lower transistor 155 and the sixth upper transistor 256 may correspond to a block selection transistor.

In an embodiment, a block selection signal BLKWL output from the first block switch BKSW-1 of the block selection circuit 1130 may be simultaneously transferred to the first pass transistor group PTR Group-1 and the second pass transistor group PTR Group-2 of the pass transistor circuit 1120 via the fifth through electrode 85. For example, the block selection signal BLKWL output from the fifth lower transistor 155 and/or the sixth upper transistor 256 may be simultaneously transferred to the gate electrodes GE of the first and third lower transistors 151 and 153 and the first and third upper transistors 251 and 253 via the fifth through electrode 85, a plurality of lower lines 161, a first bonding pad 184, a lower bonding pad 54, a plurality of first intermediate lines 53, a plurality of upper lines 261, the second bonding pads 286, an upper bonding pad 66, and a plurality of second intermediate lines 65.

Each of the first pass transistor group PTR Group-1 and the second pass transistor group PTR Group-2 simultaneously selected by the block selection signal BLKWL may transfer the operating voltage VOP from the peripheral circuit 1150 to a plurality of word lines through a corresponding one of the first to fourth through electrodes 81, 82, 83 and 84. For example, each of the first and third lower transistors 151 and 153 and the first and third upper transistors 251 and 253 may transfer the operating voltage VOP to a corresponding one of the plurality of first horizontal line layers 37 and the plurality of second horizontal line layers 48 through a corresponding one of the first to fourth through electrodes 81, 82, 83 and 84.

Referring again to FIGS. 5 and 29, in an embodiment, each of the first to fourth through electrodes 81, 82, 83 and 84 may be connected in parallel to a corresponding one of the first to fourth lower transistors 151, 152, 153 and 154 of the first pass transistor group PTR Group-1 and a corresponding one of the first to fourth upper transistors 251, 252, 253 and 254 of the second pass transistor group PTR Group-2. The block selection signal BLKWL output from the first block switch BKSW-1 of the block selection circuit 1130 may be simultaneously transferred to the first pass transistor group PTR Group-1 and the second pass transistor group PTR Group-2 of the pass transistor circuit 1120 through the fifth through electrode 85. The operating voltage VOP may be supplied stably to a corresponding one of the plurality of first horizontal line layers 37 and the plurality of second horizontal line layers 48 through each of the first to fourth through electrodes 81, 82, 83 and 84.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted in connection with the appended claims and encompass all equivalents falling within the scope of the appended claims.

What is claimed is:

1. A semiconductor device comprising:

a stacked structure including a plurality of interlayer insulating layers and a plurality of horizontal line layers alternately stacked, a plurality of channel structures passing through the plurality of interlayer insulating layers and the plurality of horizontal line layers, and a first through electrode and a second through electrode passing through the plurality of interlayer insulating layers and the plurality of horizontal line layers, each of the first through electrode and second through electrode connected to a different horizontal line layer;

a first logic structure, disposed under the stacked structure, that includes a first lower pass transistor connected to the first through electrode; and a second logic structure, disposed on the stacked structure, that includes a first upper pass transistor connected to the second through electrode.

2. The semiconductor device of claim 1, wherein each of the first through electrode and the second through electrode completely penetrates the plurality of interlayer insulating layers and the plurality of horizontal line layers.

3. The semiconductor device of claim 1, wherein upper ends of the first through electrode and the second through electrode are formed on substantially the same plane.

4. The semiconductor device of claim 1, wherein one of source/drain areas of the first lower pass transistor is connected to a lower end of the first through electrode, and one of source/drain areas of the first upper pass transistor is connected to an upper end of the second through electrode.

5. The semiconductor device of claim 1, further comprising a block selection circuit connected to the first lower pass transistor and the first upper pass transistor.

6. The semiconductor device of claim 5, further comprising a third through electrode passing through the plurality of interlayer insulating layers and the plurality of horizontal line layers, wherein the block selection circuit is electrically connected to the first lower pass transistor and the first upper pass transistor through the third through electrode.

7. The semiconductor device of claim 6, wherein the block selection circuit comprises a block selection transistor, and at least one of the first logic structure and the second logic structure comprises the block selection transistor.

8. The semiconductor device of claim 7, wherein one of source/drain areas of the block selection transistor is electrically connected to gate electrodes of the first lower pass transistor and the first upper pass transistor through the third through electrode.

9. The semiconductor device of claim 1, further comprising:

a fourth through electrode and a fifth through electrode disposed in the stacked structure;

a second lower pass transistor disposed in the first logic structure and connected to the fourth through electrode; and a second upper pass transistor disposed in the second logic structure and connected to the fifth through electrode, wherein the stacked structure comprises a first cell area, a second cell area, and a connection area between the first cell area and the second cell area arranged in a first direction, wherein the plurality of channel structures are disposed in the first cell area and the second cell area, wherein the first through electrode, the second through electrode, the fourth through electrode and the fifth through electrode are disposed in the connection area, wherein the plurality of horizontal line layers includes a first word line connected to the second through electrode and the fifth through electrode, and a second word line connected to the first through electrode and the fourth through electrode;

wherein a distance in the first direction between the first through electrode and the first cell area is substantially the same as a distance between the fourth through electrode and the second cell area, and wherein a distance in the first direction between the second through electrode and the first cell area is substantially the same as a distance between the fifth through electrode and the second cell area.

10. A semiconductor device comprising:

a stacked structure including a plurality of interlayer insulating layers and a plurality of horizontal line layers alternately stacked, a plurality of channel structures passing through the plurality of interlayer insulating layers and the plurality of horizontal line layers, and a first through electrode and a second through electrode passing through the plurality of interlayer insulating layers and the plurality of horizontal line layers, each of the first through electrode and second through electrode connected to a different horizontal line layer;

a first logic structure that is bonded to a lower portion of the stacked structure and includes a first lower pass transistor connected to the first through electrode; and a second logic structure that is bonded to an upper portion of the stacked structure and includes a first upper pass transistor connected to the second through electrode.

11. The semiconductor device of claim 10, further comprising:

a first interface formed between the stacked structure and the first logic structure; and a second interface formed between the stacked structure and the second logic structure.

12. The semiconductor device of claim 11, wherein the first logic structure further comprises a first bonding pad adjacent to the first interface and connected to the first lower pass transistor, wherein the second logic structure further comprises a second bonding pad adjacent to the second interface and connected to the first upper pass transistor, wherein the stacked structure further comprises a lower bonding pad adjacent to the first interface and connected to the first through electrode, and an upper bonding pad adjacent to the second interface and connected to the second through electrode, and wherein the lower bonding pad directly contacts the first bonding pad, and the second bonding pad directly contacts the upper bonding pad.

13. The semiconductor device of claim 10, wherein the stacked structure further comprises a third through electrode and a fourth through electrode, wherein the first logic structure further comprises a second lower pass transistor connected to the third through electrode, and the second logic structure further comprises a second upper pass transistor connected to the fourth through electrode.

14. The semiconductor device of claim 13, wherein the plurality of interlayer insulating layers comprise a plurality of first interlayer insulating layers and a plurality of second interlayer insulating layers, wherein the plurality of horizontal line layers comprise a plurality of first horizontal line layers and a plurality of second horizontal line layers, wherein the stacked structure comprises a first stacked structure having the plurality of first interlayer insulating layers and the plurality of first horizontal line layers alternately stacked, and a second stacked structure disposed on the first stacked structure and having the plurality of second interlayer insulating layers and the plurality of second horizontal line layers alternately stacked, wherein each of the first through electrode and the second through electrode is connected respectively to a pair of first horizontal line layers adjacent to each other in a stack direction, and wherein each of the third through electrode and the fourth through electrode is connected respectively to a pair of second horizontal line layers adjacent to each other in the stack direction.

15. The semiconductor device of claim 10, wherein the stacked structure further comprises a common source line that is disposed on the first stacked structure and that contacts the plurality of channel structures.

16. The semiconductor device of claim 15, wherein upper ends of the first through electrode and the second through electrode are formed on substantially the same plane as a lower surface of the common source line.

17. The semiconductor device of claim 10, wherein the first logic structure further comprises a first substrate, and the first lower pass transistor is disposed between the first substrate and the stacked structure, and wherein the second logic structure further comprises a second substrate, and the first upper pass transistor is disposed between the second substrate and the stacked structure.

18. The semiconductor device of claim 10, wherein the first logic structure further comprises a page buffer circuit connected to the plurality of channel structures.

19. The semiconductor device of claim 10, wherein the stacked structure further comprises a plurality of contact spacers surrounding side surfaces of the first through electrode and the second through electrode, and a plurality of connection pads connected to the plurality of horizontal line layers, wherein one of the plurality of connection pads horizontally passes through one of the plurality of contact spacers and directly contacts a side surface of the first through electrode.

20. A semiconductor device comprising:

a stacked structure including a plurality of interlayer insulating layers and a plurality of horizontal line layers alternately stacked, a plurality of channel structures passing through the plurality of interlayer insulating layers and the plurality of horizontal line layers, and a first through electrode and a second through electrode passing through the plurality of interlayer insulating layers and the plurality of horizontal line layers and connected to the plurality of horizontal line layers;

a first logic structure, disposed under the stacked structure, that includes a first lower pass transistor connected to the first through electrode and a second lower pass transistor connected to the second through electrode; and a second logic structure, disposed on the stacked structure, that includes a first upper pass transistor connected to the first through electrode and a second upper pass transistor connected to the second through electrode.

* * * * *